(12) United States Patent  
Miyairi et al.

(10) Patent No.: US 8,476,744 B2  
(45) Date of Patent: Jul. 2, 2013

(54) THIN FILM TRANSISTOR WITH CHANNEL INCLUDING MICROCRYSTALLINE AND AMORPHOUS SEMICONDUCTOR REGIONS

(75) Inventors: Hiekazu Miyairi, Kanagawa (JP); Shinya Sasagawa, Kanagawa (JP); Motomu Kurata, Kanagawa (JP); Asami Tadokoro, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 159 days.

(21) Appl. No.: 12/978,049

(22) Filed: Dec. 23, 2010

(65) Prior Publication Data

US 2012/0001178 A1 Jan. 5, 2012

(30) Foreign Application Priority Data

Dec. 28, 2009 (JP) ................................ 2009-298372

(51) Int. Cl.
*H01L 21/02* (2006.01)
(52) U.S. Cl.
USPC ................... 257/655; 257/E29.273; 257/316; 257/219
(58) Field of Classification Search
USPC .......................... 257/655, 316, 259, E29.273
See application file for complete search history.

(56) References Cited

U.S. PATENT DOCUMENTS

| | | | |
|---|---|---|---|
| 4,242,156 A | 12/1980 | Peel | |
| 4,409,134 A | 10/1983 | Yamazaki | |
| 4,581,620 A | 4/1986 | Yamazaki et al. | |
| 5,101,242 A | 3/1992 | Ikeda et al. | |
| 5,221,631 A | 6/1993 | Ikeda et al. | |
| 5,262,654 A | 11/1993 | Yamazaki | |
| RE34,658 E | 7/1994 | Yamazaki et al. | |
| 5,414,442 A | 5/1995 | Yamazaki et al. | |
| 5,453,858 A | 9/1995 | Yamazaki | |
| 5,514,879 A | 5/1996 | Yamazaki | |

(Continued)

FOREIGN PATENT DOCUMENTS

| | | |
|---|---|---|
| DE | 1 973 6204 B4 | 2/1998 |
| DE | 197 36 20 B4 | 2/1998 |

(Continued)

OTHER PUBLICATIONS

Kim C. et al., "A Novel Four-Mask-Count Process Architecture for TFT-LCDS,", SID Digest '00: SID International Symposium Digest of Technical Papers, 2000, vol. 31, pp. 1006-1009.

(Continued)

*Primary Examiner* — Eva Yan Montalvo
(74) *Attorney, Agent, or Firm* — Nixon Peabody LLP; Jeffrey L. Costellia

(57) ABSTRACT

A thin film transistor with favorable electric characteristics is provided. The thin film transistor includes a gate electrode, a gate insulating layer, a semiconductor layer which includes a microcrystalline semiconductor region and an amorphous semiconductor region, an impurity semiconductor layer, a wiring, a first oxide region provided between the microcrystalline semiconductor region and the wiring, and a second oxide region provided between the amorphous semiconductor region and the wiring, wherein a line tangent to the highest inclination of an oxygen profile in the first oxide region (m1) and a line tangent to the highest inclination of an oxygen profile in the second oxide region (m2) satisfy a relation of 1<m1/m2<10, on the semiconductor layer side from an intersection of a profile of an element included in the wiring and a profile of an element included in the semiconductor layer.

23 Claims, 19 Drawing Sheets

U.S. PATENT DOCUMENTS

| | | |
|---|---|---|
| 5,571,578 A | 11/1996 | Kaji et al. |
| 5,591,987 A | 1/1997 | Yamazaki et al. |
| 5,614,732 A | 3/1997 | Yamazaki |
| 5,648,662 A | 7/1997 | Zhang et al. |
| 5,650,339 A | 7/1997 | Saito et al. |
| 5,652,453 A | 7/1997 | Iwamatsu et al. |
| 5,656,825 A | 8/1997 | Kusumoto et al. |
| 5,677,236 A | 10/1997 | Saitoh et al. |
| 5,701,167 A | 12/1997 | Yamazaki |
| 5,728,259 A | 3/1998 | Suzawa et al. |
| 5,766,989 A | 6/1998 | Maegawa et al. |
| 5,773,330 A | 6/1998 | Park |
| 5,835,172 A | 11/1998 | Yeo et al. |
| 5,849,601 A | 12/1998 | Yamazaki |
| 5,859,445 A | 1/1999 | Yamazaki |
| 5,864,150 A | 1/1999 | Lin |
| 5,932,302 A | 8/1999 | Yamazaki et al. |
| 5,989,998 A | 11/1999 | Sugahara et al. |
| 6,010,922 A | 1/2000 | Hata et al. |
| 6,011,277 A | 1/2000 | Yamazaki |
| 6,013,930 A | 1/2000 | Yamazaki et al. |
| 6,023,075 A | 2/2000 | Yamazaki |
| 6,030,873 A | 2/2000 | Iwamatsu et al. |
| 6,087,698 A | 7/2000 | Saito et al. |
| 6,091,467 A | 7/2000 | Kubo et al. |
| 6,100,558 A | 8/2000 | Krivokapic et al. |
| 6,104,065 A | 8/2000 | Park |
| 6,121,660 A | 9/2000 | Yamazaki et al. |
| 6,153,893 A | 11/2000 | Inoue et al. |
| 6,171,674 B1 | 1/2001 | Yamazaki et al. |
| 6,183,816 B1 | 2/2001 | Yamazaki et al. |
| 6,218,219 B1 | 4/2001 | Yamazaki et al. |
| 6,252,249 B1 | 6/2001 | Yamazaki |
| 6,281,520 B1 | 8/2001 | Yamazaki |
| 6,306,213 B1 | 10/2001 | Yamazaki |
| 6,387,737 B1 | 5/2002 | Yamazaki et al. |
| 6,388,291 B1 | 5/2002 | Zhang et al. |
| 6,426,245 B1 | 7/2002 | Kawasaki et al. |
| 6,433,361 B1 | 8/2002 | Zhang et al. |
| 6,468,617 B1 | 10/2002 | Yamazaki et al. |
| 6,468,839 B2 | 10/2002 | Inoue et al. |
| 6,498,369 B1 | 12/2002 | Yamazaki et al. |
| 6,555,843 B1 | 4/2003 | Yamazaki et al. |
| 6,558,756 B2 | 5/2003 | Sugahara et al. |
| 6,559,548 B1 | 5/2003 | Matsunaga et al. |
| 6,693,044 B1 | 2/2004 | Yamazaki et al. |
| 6,737,676 B2 | 5/2004 | Yamazaki |
| 6,744,008 B1 | 6/2004 | Kasahara et al. |
| 6,756,258 B2 | 6/2004 | Zhang et al. |
| 6,835,523 B1 | 12/2004 | Yamazaki et al. |
| 6,864,583 B2 | 3/2005 | Matsunaga et al. |
| 6,876,039 B2 | 4/2005 | Okihara |
| 7,060,323 B2 | 6/2006 | Sugahara et al. |
| 7,067,844 B2 | 6/2006 | Yamazaki |
| 7,067,845 B2 | 6/2006 | Murakami et al. |
| 7,098,479 B1 | 8/2006 | Yamazaki |
| 7,102,718 B1 | 9/2006 | Yamazaki et al. |
| 7,115,902 B1 | 10/2006 | Yamazaki |
| 7,115,903 B2 | 10/2006 | Isobe et al. |
| 7,157,358 B2 | 1/2007 | Hall et al. |
| 7,164,171 B2 | 1/2007 | Yamazaki et al. |
| 7,164,717 B2 | 1/2007 | Katsavounidis et al. |
| 7,183,211 B2 | 2/2007 | Konno et al. |
| 7,199,846 B2 | 4/2007 | Lim |
| 7,259,429 B2 | 8/2007 | Yamazaki |
| 7,365,805 B2 | 4/2008 | Maekawa et al. |
| 2002/0009890 A1 | 1/2002 | Hayase et al. |
| 2002/0055209 A1 | 5/2002 | Kusumoto et al. |
| 2004/0026696 A1 | 2/2004 | Yamazaki et al. |
| 2004/0113214 A1 | 6/2004 | Takenaka |
| 2004/0206956 A1 | 10/2004 | Yanai et al. |
| 2005/0012097 A1 | 1/2005 | Yamazaki |
| 2005/0012151 A1 | 1/2005 | Yamaguchi et al. |
| 2005/0022864 A1 | 2/2005 | Fujioka et al. |
| 2005/0062129 A1 | 3/2005 | Komatsubara |
| 2005/0115930 A1 | 6/2005 | Tanaka et al. |
| 2005/0116305 A1 | 6/2005 | Hwang et al. |
| 2006/0049449 A1 | 3/2006 | Iino et al. |
| 2006/0113894 A1 | 6/2006 | Fujii et al. |
| 2007/0034841 A1 | 2/2007 | Itoh et al. |
| 2007/0045627 A1 | 3/2007 | Park et al. |
| 2007/0080374 A1 | 4/2007 | Kurokawa |
| 2007/0123035 A1 | 5/2007 | Sugimoto et al. |
| 2007/0176176 A1 | 8/2007 | Yamazaki et al. |
| 2007/0181945 A1 | 8/2007 | Nakamura |
| 2007/0252179 A1 | 11/2007 | Isobe et al. |
| 2007/0281400 A1 | 12/2007 | Yamazaki et al. |
| 2008/0128703 A1 | 6/2008 | Ikeda et al. |
| 2008/0128808 A1 | 6/2008 | Yamazaki et al. |
| 2008/0132066 A1 | 6/2008 | Phan et al. |
| 2009/0001375 A1 | 1/2009 | Yamazaki et al. |
| 2009/0002591 A1 | 1/2009 | Yamazaki et al. |
| 2009/0026454 A1 | 1/2009 | Kurokawa et al. |
| 2009/0033818 A1 | 2/2009 | Nakajima et al. |
| 2009/0045409 A1 | 2/2009 | Yamazaki et al. |
| 2009/0047775 A1 | 2/2009 | Yamazaki et al. |
| 2009/0057683 A1 | 3/2009 | Nakajima et al. |
| 2009/0061574 A1 | 3/2009 | Nakajima et al. |
| 2009/0321737 A1 | 12/2009 | Isa et al. |
| 2010/0059749 A1* | 3/2010 | Takahashi et al. .............. 257/57 |
| 2010/0148177 A1* | 6/2010 | Koyama et al. ................. 257/59 |
| 2010/0224879 A1* | 9/2010 | Miyairi et al. ................... 257/57 |
| 2011/0147745 A1 | 6/2011 | Sasagawa et al. |
| 2011/0147755 A1 | 6/2011 | Miyairi et al. |

FOREIGN PATENT DOCUMENTS

| | | |
|---|---|---|
| EP | 0 532 314 A1 | 3/1993 |
| EP | 0 535 979 A2 | 4/1993 |
| EP | 0 826 791 A2 | 3/1998 |
| EP | 1 045 447 A2 | 10/2000 |
| EP | 1 050 599 A2 | 11/2000 |
| EP | 1 182 275 A2 | 2/2002 |
| EP | 1 207 217 A1 | 5/2002 |
| EP | 1 333 476 A2 | 8/2003 |
| EP | 1 536 482 A1 | 6/2005 |
| JP | 57-071126 | 5/1982 |
| JP | 58-092217 | 6/1983 |
| JP | 59-072781 | 4/1984 |
| JP | 59-150469 | 8/1984 |
| JP | 01-117068 | 5/1989 |
| JP | 01-191479 | 8/1989 |
| JP | 04-242724 | 8/1992 |
| JP | 04-266019 | 9/1992 |
| JP | 05-129608 | 5/1993 |
| JP | 06-037313 | 2/1994 |
| JP | 06-326312 | 11/1994 |
| JP | 07-131030 | 5/1995 |
| JP | 07-176753 | 7/1995 |
| JP | 07-211708 | 8/1995 |
| JP | 07-335906 | 12/1995 |
| JP | 08-018055 | 1/1996 |
| JP | 08-125195 | 5/1996 |
| JP | 08-153699 | 6/1996 |
| JP | 08-335702 | 12/1996 |
| JP | 09-023010 | 1/1997 |
| JP | 10-020298 | 1/1998 |
| JP | 11-121761 | 4/1999 |
| JP | 11-258636 | 9/1999 |
| JP | 2000-277439 | 10/2000 |
| JP | 2001-007024 | 1/2001 |
| JP | 2001-053283 | 2/2001 |
| JP | 3474286 | 12/2003 |
| JP | 2004-014958 | 1/2004 |
| JP | 2005-019859 | 1/2005 |
| JP | 2005-049832 | 2/2005 |
| JP | 2005-167051 | 6/2005 |
| JP | 2005-167207 | 6/2005 |
| JP | 2005-183774 | 7/2005 |
| JP | 2005-191546 | 7/2005 |
| JP | 2008-124392 | 5/2008 |
| JP | 2009-044134 | 2/2009 |
| WO | WO 2004/086487 A1 | 10/2004 |

OTHER PUBLICATIONS

Fujiwara.H et al., "Real-time spectroscopic ellipsometry studies of the nucleation and grain growth processes in microcrystalline silicon thin films,", Phys. Rev. B (Physical Review. B), Feb. 23, 2001, vol. 63, pp. 115306-1-115306-9.

Arai.T et al., "41.2: Micro Silicon Technology for Active Matrix OLED Display,", SID Digest '07: SID International Symposium Digest of Technical Papers, 2007, vol. 38, pp. 1370-1373.

Fujiwara.H et al., "Microcrystalline silicon nucleation sites in the sub-surface of hydrogenated amorphous silicon,", Surface Science, 2002, vol. 497, No. 1-3, pp. 333-340.

Fujiwara.H et al., "Stress-Induced Nucleation of Microcrystalline Silicon from Amorphous Phase,", Jpn. J. Appl. Phys. (Japanese Journal of Applied Physics), May 15, 2002, vol. 41, Part 1, No. 5A, pp. 2821-2828.

Kamei.T et al., "A Significant Reduction of Impurity Contents in Hydrogenated Microcrystalline Silicon Films for Increased Grain Size and Reduced Defect Density,", Jpn. J. Appl. Phys. (Japanese Journal of Applied Physics), Mar. 1, 1998, vol. 37, Part 2, No. 3A, pp. L265-L268.

Lee.C et al., "How to Achieve High Mobility Thin Film Transistors by Direct Deposition of Silicon using 13.56 MHZ RF PECVD?,", IEDM 06: Technical Digest of International Electron Devices Meeting, Dec. 11, 2006, pp. 295-298.

Lee.C et al., "Directly Deposited Nanocrystalline Silicon Thin-Film Transistors with Ultra High Mobilities,", Appl. Phys. Lett. (Applied Physics Letters), Dec. 18, 2006, vol. 89, No. 25, pp. 252101-1-252101-3.

Song.J et al., "34.1; Advanced Four-Mask Process Architecture for the A-SI TFT Array Manufacturing Method,", SID Digest '02 : SID International Symposium Digest of Technical Papers, 2002, vol. 32, pp. 1038-1041.

Choi.S et al., "P-16: Novel Four-Mask Process in the FFS TFT-LCD with Optimum Multiple-Slit Design Applied by the Use of a Gray-Tone Mask,", SID Digest '05 : SID International Symposium Digest of Technical Papers, 2005, vol. 36, pp. 284-287.

Lee.C et al., "High-Mobility Nanocrystalline Silicon Thin-Film Transistors Fabricated by Plasma-Enhanced Chemical Vapor Deposition,", Appl. Phys. Lett. (Applied Physics Letters), May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for Amoled Displays,", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors,", Appl. Phys. Lett. (Applied Physics Letters), Feb. 28, 2008, vol. 92, pp. 083509-1-083509-3.

Esmaeili-Rad.M et al., "Absence of Defect State Creation in Nanocrystalline Silicon Thin-Film Transistors Deduced from Constant Current Stress Measurements,", Appl. Phys. Lett. (Applied Physics Letters), Sep. 12, 2007, vol. 91, No. 11, pp. 113511-1-113511-3.

Lee.C et al., "Stability of NC-SI:H TFTS with Silicon Nitride Gate Dielectric,", IEEE Transactions on Electron Devices, 2007. vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Esmaeili-Rad.M et al., "Stability of Nanocrystalline Silicon Bottom-Gate Thin-Film Transistors with Silicon Nitride Gate Dielectric,", J. Appl. Phys. (Journal of Applied Physics), Sep. 28, 2007, vol. 102, No. 6, pp. 064512-1-064512-7.

Lee.C et al., "Top-Gate TFTS Using 13.56MHZ PECVD Microcrystalline Silicon,", IEEE Electron Device Letters, Sep. 5, 2005, vol. 26, No. 9, pp. 637-639.

Lee.C et al., "Postdeposition Thermal Annealing and Material Stability of 75° C Hydrogenated Nanocrystalline Silicon Plasma-Enhanced Chemical Vapor Deposition Films,". J. Appl. Phys. (Journal Of Applied Physics), Aug. 4, 2005, vol. 98, No. 3, pp. 034305-1-034305-7.

* cited by examiner

100nm

100nm

THIN FILM TRANSISTOR WITH CHANNEL INCLUDING MICROCRYSTALLINE AND AMORPHOUS SEMICONDUCTOR REGIONS

BACKGROUND OF THE INVENTION

1. Field of the Invention

The present invention relates to a thin film transistor, a method for manufacturing the thin film transistor, and a display device to which the thin film transistor is applied.

2. Description of the Related Art

As one type of field-effect transistor, a thin film transistor whose channel formation region is formed using a semiconductor layer that is formed over a substrate having an insulating surface is known. Techniques for using amorphous silicon, microcrystalline silicon, and polycrystalline silicon for semiconductor layers in thin film transistors have been disclosed (see References 1 to 5). A typical application of thin film transistors is a liquid crystal television device, in which thin film transistors have been put to practical use as a switching transistor for each pixel that constitutes a display screen.

REFERENCE

[Patent Document 1] Japanese Published Patent Application No. 2001-053283

[Patent Document 2] Japanese Published Patent Application No. H5-129608

[Patent Document 3] Japanese Published Patent Application No. 2005-049832

[Patent Document 4] Japanese Published Patent Application No. H7-131030

[Patent Document 5] Japanese Published Patent Application No. 2005-191546

SUMMARY OF THE INVENTION

In a thin film transistor whose channel is formed using an amorphous silicon layer with a wide band gap, when an electric field is applied to a wiring and the side of the amorphous silicon layer, carriers are not injected to the wiring from the amorphous silicon layer via the side of the amorphous silicon layer, and the off current does not become high. However, such a thin film transistor has a problem of low field-effect mobility and low on current.

On the other hand, a thin film transistor whose channel is formed using a microcrystalline silicon layer with a small band gap has higher field-effect mobility than the thin film transistor whose channel is formed using an amorphous silicon layer. However, when an electric field is applied to a wiring and the side of the microcrystalline silicon layer, the barrier potential in the region where the electric-field is applied is reduced; thus, carriers are injected from the microcrystalline silicon layer to the wiring, and the off current becomes high. As a result, such a thin film transistor including a microcrystalline silicon layer has a problem of insufficient switching characteristics.

Further, an interface between the side of the microcrystalline silicon layer and the wiring is provided on an outer side than the end portion of the gate electrode, whereby a structure in which an electric field is not applied to the interface between the side of the microcrystalline silicon and the wiring can be formed. In such a structure, the microcrystalline silicon layer is extended to an outer side of the gate electrode in a planar shape; thus, an electric field is not applied to the interface between the side of the microcrystalline silicon layer and the wiring, and carriers are not injected from the microcrystalline silicon layer to the wiring. However, the microcrystalline silicon layer absorbs light, typically back light from the substrate side, which causes generation of photocurrent. As a result, the off current becomes high in an environment of practical usage, and the off current cannot be reduced.

A thin film transistor in which a polycrystalline silicon layer is used for a channel formation region has characteristics such as much higher field effect mobility and higher on current than the above-described two types of thin film transistors. Because of such characteristics, this thin film transistor can be used not only as a switching transistor provided in a pixel but also in a driver circuit for which high-speed operation is required.

However, the thin film transistor whose channel is formed using a polycrystalline silicon layer requires a crystallization step for a semiconductor layer and has a problem of higher manufacturing cost, as compared to the thin film transistor whose channel is formed using an amorphous silicon layer. For example, a laser annealing technique involved in the process for forming a polycrystalline silicon layer has a problem in that large-screen liquid crystal panels cannot be produced efficiently because the laser beam irradiation area is small.

A mother glass substrate for manufacturing display panels has been grown in size from year to year as follows: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), and the 8th generation (2200 mm×2400 mm), the 9th generation (2400 mm×2800 mm or 2450 mm×3050 mm) and the 10th generation (2950 mm×3400 mm). The increase in size of glass substrate is based on the concept of minimum cost design.

On the other hand, a technique with which a thin film transistor capable of high-speed operation can be manufactured with high productivity over a large-area mother glass substrate like that of the 10th generation (2950 mm×3400 mm) has not been established yet, which is a problem in industry.

Therefore, it is an object of an embodiment of the present invention to provide a thin film transistor which has favorable electric characteristics. It is another object of an embodiment of the present invention is to provide a method for manufacturing a thin film transistor which has favorable electric characteristics with high productivity.

One embodiment of the present invention is a thin film transistor including a gate insulating layer which covers a gate electrode, a semiconductor layer which is in contact with the gate insulating layer and includes a microcrystalline semiconductor region having a projected and depressed shape and an amorphous semiconductor region, an impurity semiconductor layer which is in contact with a part of the semiconductor layer and functions as a source region and a drain region, a wiring in contact with the impurity semiconductor layer, a first oxide region provided between the microcrystalline semiconductor region and the wiring, and a second oxide region provided between the amorphous semiconductor region and the wiring. In the thin film transistor, a line tangent to the highest inclination of an oxygen profile in the first oxide region (m1) and a line tangent to the highest inclination of an oxygen profile in the second oxide region (m2) satisfy a relation of 1<m1/m2<10, on the semiconductor layer side from an intersection of a profile of an element included in the wiring and a profile of an element included in the semiconductor layer, which are manufactured by energy dispersive X-ray spectroscopy (EDX). Note that the semiconductor layer may have a smaller area than the gate electrode, and the whole semiconductor layer may overlap with the gate electrode.

One embodiment of the present invention is a thin film transistor including a gate insulating layer which covers a gate electrode, an insulating layer, a back-gate electrode which is in contact with the insulating layer, a semiconductor layer which includes a microcrystalline semiconductor region having a projected and depressed shape and an amorphous semiconductor region and is provided between the gate insulating layer and the insulating layer, an impurity semiconductor layer provided over the semiconductor layer, a wiring which is in contact with the impurity semiconductor layer, a first oxide region provided between the microcrystalline semiconductor region and the wiring, and a second oxide region provided between the amorphous semiconductor region and the wiring. In the thin film transistor, a line tangent to the highest inclination of an oxygen profile in the first oxide region (m1) and a line tangent to the highest inclination of an oxygen profile in the second oxide region (m2) satisfy a relation of $1<m1/m2<10$, on the semiconductor layer side from an intersection of a profile of an element included in the wiring and a profile of an element included in the semiconductor layer, which are manufactured by energy dispersive X-ray spectroscopy. Note that the semiconductor layer may have a smaller area than the gate electrode, and the whole semiconductor layer may overlap with the gate electrode.

The ratio of the line tangent to the highest inclination of an oxygen profile in the first oxide region (m1) to the line tangent to the highest inclination of an oxygen profile in the second oxide region (m2) satisfies $1<m1/m2<10$, on the semiconductor layer side, typically, in a range of equal to or less than 10 nm from the intersection of a profile of an element included in the wiring and a profile of an element included in the semiconductor layer, which are manufactured by energy dispersive X-ray spectroscopy. The ratio indicates that the first oxide region formed between the wiring and the microcrystalline semiconductor region has a larger amount of oxygen measured by energy dispersive X-ray spectroscopy than the second oxide region formed between the wiring and the amorphous semiconductor region. That is, the first oxide region formed between the wiring and the microcrystalline semiconductor region has a high insulating property. Therefore, a barrier can be formed between the microcrystalline semiconductor region and the wiring, and carriers injected from the wiring to the microcrystalline semiconductor region can be reduced. As a result, the off current of the thin film transistor can be reduced.

The microcrystalline semiconductor region and the amorphous semiconductor region included in the semiconductor layer each include nitrogen. The nitrogen concentration profile has a peak concentration within the range of $1\times10^{20}$ atoms/cm$^3$ to $1\times10^{21}$ atoms/cm$^3$ inclusive, preferably $2\times10^{20}$ atoms/cm$^3$ to $1\times10^{21}$ atoms/cm$^3$ inclusive. Further, in the amorphous semiconductor region, semiconductor crystal grains whose grain size is equal to or greater than 1 nm and equal to or less than 10 nm may be dispersed. In this specification, the concentration is a value measured by secondary ion mass spectrometry (SIMS) unless a method for measuring the concentration is mentioned.

Furthermore, the microcrystalline semiconductor region and the amorphous semiconductor region may include a nitrogen, an NH group, or an NH$_2$ group. In addition, dangling bonds of semiconductor atoms which exist at the interface between adjacent microcrystalline semiconductor grains (i.e., crystal grain boundaries) and the interface between the microcrystalline semiconductor region and the amorphous semiconductor region are cross-linked with an NH group and thus defect levels are reduced, so that a path through which carriers are transferred is formed. Alternatively, a dangling bond is terminated with an NH$_2$ group and thus defect levels are reduced.

The barrier region provided between the semiconductor layer and the wiring is an insulating region or an amorphous region. The insulating region is formed of semiconductor nitride or semiconductor oxide. Examples of the semiconductor nitride include silicon nitride, silicon nitride-oxide, and the like. Examples of the semiconductor oxide include silicon oxide, silicon oxynitride, and the like. When the insulating region is provided between the semiconductor layer and the wiring, the insulating region functions as a barrier region, and thus, hole injection from the semiconductor layer to the wiring can be reduced.

The amorphous region of the barrier region is an amorphous region which has a wider band gap than the microcrystalline semiconductor region in the semiconductor layer, and it is typically formed of amorphous silicon, amorphous silicon germanium, amorphous germanium, or the like. When the amorphous region which has a wider band gap than the microcrystalline semiconductor region is provided between the semiconductor layer and the wiring, the amorphous region functions as a barrier region, and thus hole injection from the semiconductor layer to the wiring can be reduced.

As a result, in the thin film transistor, resistance between the gate insulating layer and the source and drain regions of when voltage is applied to a source or drain electrode can be reduced, whereby the on current and field-effect mobility of the thin film transistor can be increased. The amorphous semiconductor region is a well-ordered semiconductor region which has fewer defects and whose tail of a level at a band edge in the valence band is steep; therefore, the band gap gets wider, and tunneling current does not easily flow. Therefore, by providing the amorphous semiconductor region on the back channel side, the off current of the thin film transistor can be reduced. Further, by providing an oxide region functioning as a barrier region between the semiconductor layer and the wiring, carriers injected from the microcrystalline semiconductor region with a small band gap to the wiring can be reduced, whereby the off current can be reduced.

Note that the term "back channel" is a region in the semiconductor layer, which does not overlap with the source region nor the drain region and is provided on the insulating layer side which covers the wiring and the semiconductor layer.

Note that the term "on current" refers to a current which flows between a source electrode and a drain electrode when a thin film transistor is on.

In addition, the term "off current" refers to a current which flows between a source electrode and a drain electrode when a thin film transistor is off.

As described above, the off current of the thin film transistor can be reduced, and the on current and the field-effect mobility can be increased. Further, a thin film transistor with low off current, high on current, high field-effect mobility, and extremely high on/off ratio can be manufactured with high productivity.

DETAILED DESCRIPTION OF THE INVENTION

Figure 1A:
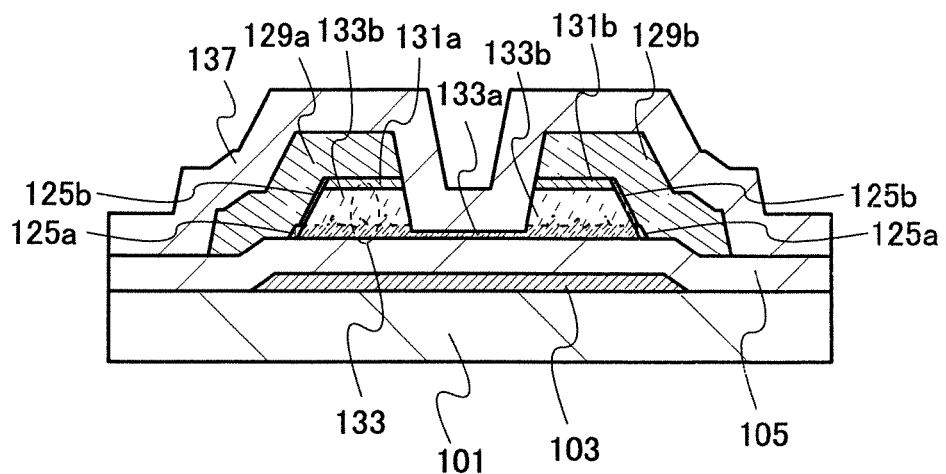
FIGS. 1A and 1B are cross-sectional views each illustrating a thin film transistor according to one embodiment of the present invention.

Hereinafter, embodiments of the present invention are described with reference to the drawings. However, the present invention is not limited to the following description. It is easily understood by those skilled in the art that the mode and detail can be variously changed unless departing from the scope and spirit of the present invention. Therefore, the present invention is not construed as being limited to the following description of the embodiments and an example. Note that reference numerals denoting the same portions are commonly used in different drawings.

(Embodiment 1)

In this embodiment, a thin film transistor which is one embodiment of the present invention will be described with reference to FIGS. 1A to 1C. Note that an n-channel thin film transistor has higher carrier mobility than a p-channel thin film transistor. Further, it is preferable that all thin film transistors formed over one substrate have the same polarity because the number of manufacturing steps can be reduced. In this embodiment, an n-channel thin film transistor will be described.

Figure 1B:
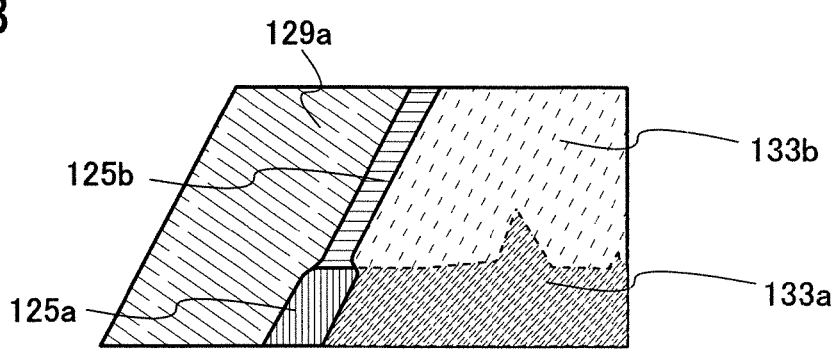

FIGS. 1A and 1B are cross-sectional views illustrating a thin film transistor described in this embodiment.

The thin film transistor illustrated in FIG. 1A includes, over a substrate 101, a gate electrode 103, a semiconductor layer 133, a gate insulating layer 105 provided between the gate electrode 103 and the semiconductor layer 133, impurity semiconductor layers 131a and 131b which are in contact with the semiconductor layer 133 and function as a source region and a drain region, and wirings 129a and 129b which are in contact with the impurity semiconductor layers 131a and 131b. In addition, an oxide region is provided on the side of the semiconductor layer 133, that is, provided between the semiconductor layer 133 and the wirings 129a and 129b. Further, an insulating layer 137 may be provided to cover the semiconductor layer 133, the impurity semiconductor layers 131a and 131b, and the wirings 129a and 129b.

The semiconductor layer 133 includes a microcrystalline semiconductor region 133a and an amorphous semiconductor region 133b which indicates an amorphous semiconductor region divided into two parts (thus, also referred to as a pair of amorphous semiconductor regions 133b). The microcrystalline semiconductor region 133a has a surface which is in contact with the gate insulating layer 105 (hereinafter, referred to as a first surface) and a surface which faces the first surface and is in contact with the pair of amorphous semiconductor regions 133b and the insulating layer 137 (hereinafter, referred to as a second surface). The amorphous semiconductor region 133b has a surface which is in contact with the microcrystalline semiconductor region 133a (hereinafter, referred to as a first surface in this embodiment) and a surface which faces the first surface and is in contact with a pair of impurity semiconductor layers 131a and 131b (hereinafter, referred to as a second surface in this embodiment). That is, in a region of the semiconductor layer 133 which overlaps with the gate electrode 103, the microcrystalline semiconductor region 133a is in contact with the insulating layer 137 and the gate insulating layer 105 which is in contact with the gate electrode 103. An area of the semiconductor layer 133 is smaller than that of the gate electrode 103, and the whole semiconductor layer 133 overlaps with the gate electrode 103.

The oxide region formed between the semiconductor layer 133 and the wirings 129a and 129b specifically indicates a first oxide region 125a and a second oxide region 125b. The first oxide region 125a is formed between the microcrystalline semiconductor region 133a and the wirings 129a and 129b, and the second oxide region 125b is formed between the amorphous semiconductor region 133b and the wirings 129a and 129b.

Figure 2:
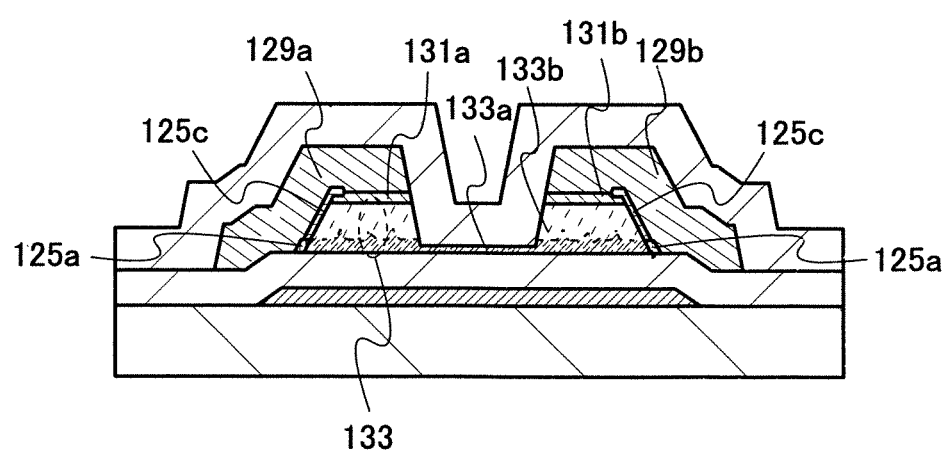
FIG. 2 is a cross-sectional view illustrating a thin film transistor according to one embodiment of the present invention.

Alternatively, as illustrated in FIG. 2, the oxide region may include the first oxide region 125a which is formed on the side of the microcrystalline semiconductor region 133a and a second oxide region 125c which is formed not only on the side of the amorphous semiconductor region 133b but also on the side and a part of the surface of the pair of impurity semiconductor layers 131a and 131b.

FIG. 1B is a schematic view which illustrates the enlarged vicinity between the semiconductor layer 133 and the wiring 129a of FIG. 1A. The first oxide region 125a formed on the side of the microcrystalline semiconductor region 133a is formed by oxidizing a part of the microcrystalline semiconductor region 133a and is typically formed of semiconductor oxide. Examples of the semiconductor oxide include silicon oxide, silicon oxynitride, and the like.

The second oxide region 125b formed on the side of the amorphous semiconductor region 133b is formed of a semiconductor oxide or an oxide of an element included in the wiring 129a. Examples of the semiconductor oxide include silicon oxide, silicon oxynitride, and the like. Examples of the oxide of a metal element included in the wiring 129a include titanium oxide, aluminum oxide, manganese oxide, magnesium oxide, molybdenum oxide, zirconium oxide, vanadium oxide, nickel oxide, and the like.

Since the microcrystalline semiconductor has higher atomic density than the amorphous semiconductor, the coefficient of volume expansion of the first oxide region which is formed by oxidizing the microcrystalline semiconductor region is higher than that of the second oxide region which is formed by subjecting the amorphous semiconductor region to the similar treatment. Thus, the first oxide region can have a large thickness. As a result, the first oxide region having a high insulating property can be formed.

Note that the semiconductor oxide and the oxide of the metal element of the wiring 129a, which are included in the first oxide region 125a and the second oxide region 125b do not necessarily satisfy the stoichiometric proportion.

Figure 1C:
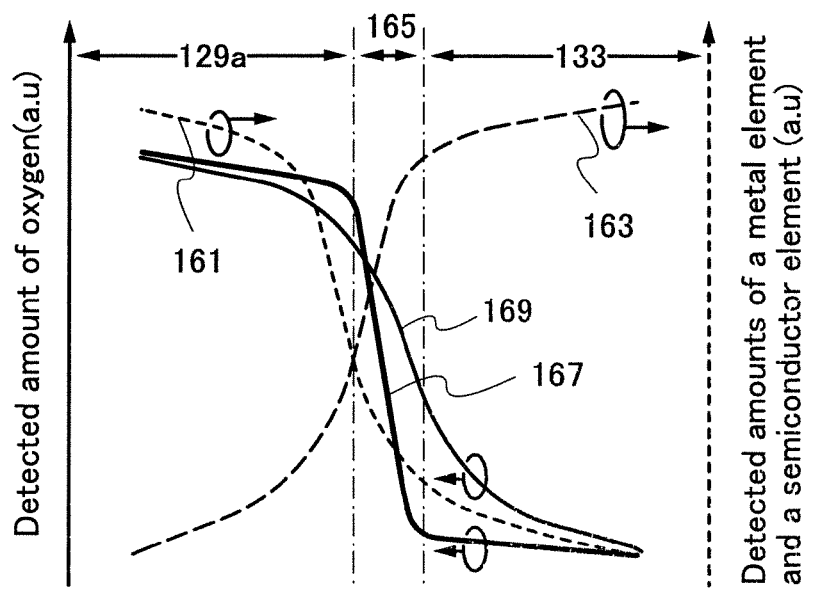
FIG. 1C shows a profile of the thin film transistor.

FIG. 1C shows profiles, in the vicinity between the semiconductor layer 133 and the wiring 129a, of a metal element included in the wiring 129a, a semiconductor element included in the semiconductor layer 133, and oxygen, which are measured by energy dispersive X-ray spectroscopy. A broken line 161 represents a profile of a metal element of the wiring 129a; a broken line 163, a profile of a semiconductor element included in the semiconductor layer 133; a solid line 167, a profile of oxygen in the first oxide region formed on the side of the microcrystalline semiconductor region 133a; and a solid line 169, a profile of oxygen in the second oxide region formed on the side of the amorphous semiconductor region 133b. Note that the detected amounts of the broken lines 161 and 163 are referred to the right side as indicated by a right-pointing arrow, and the detected amounts of the solid lines 167 and 169 are referred to the left side as indicated by a left-pointing arrow. That is, the degrees of the detected amount on the right side and the detected amount on the left side differ from each other. Although the detected amounts, in the wiring 129a, of the metal element included in the wiring, oxygen in the first oxide region, and oxygen in the second oxide region seem to be substantially equivalent, actually, the detected amount of a metal and a semiconductor element included in the wiring is larger. Further, the oxygen profile in the wiring 129a is determined by the coefficient of oxygen diffusion to the metal element included in the wiring, the coefficient of oxygen diffusion to a metal oxide which is formed by bonding oxygen and the metal element included in the wiring, and the coefficient of oxygen diffusion from the metal oxide to the metal element included in the wiring, which varies depending on the material.

There is a difference in the degree of inclination between the solid line 167 representing the oxygen profile in the first oxide region and the solid line 169 representing the oxygen profile in the second oxide region, in a region which is shifted from an intersection toward the semiconductor layer 133 side by a constant distance 165 (typically, 10 nm). Here, the intersection is a portion where the profile of the metal element included in the wiring and the profile of the semiconductor metal included in the semiconductor layer intersect with each other. The solid line 167 representing the oxygen profile in the first oxide region has a steeper inclination in the range of a constant distance 165. The relation represented by the following Mathematical Formula 1 is satisfied, $$1 < m1/m2 < 10 \qquad \text{(Mathematical Formula 1)}$$

where m1 refers to the highest inclination of the solid line 167 representing the oxygen profile in the first oxide region, and m2 refers to the highest inclination of the solid line 169 representing the oxygen profile in the second oxide region.

It is found that the first oxide region contains a large amount of oxygen because the highest inclination of the solid line 167 representing the oxygen profile in the first oxide region is a steep inclination. In other words, the first oxide region is an oxide region having a high insulating property.

On the other hand, the highest inclination of the solid line 169 representing the oxygen profile in the second oxide region is a gentle inclination; thus, it is found that the second oxide region contains a small amount of oxygen.

The thin film transistor described in this embodiment has a structure in which the area of the semiconductor layer 133 is smaller than that of the gate electrode 103 and the whole semiconductor layer 133 overlaps with the gate electrode 103, and thereby the gate electrode 103 functions to block light traveling toward the semiconductor layer 133. Because of such a structure, irradiation of the semiconductor layer 133 with light from the substrate side can be reduced. Therefore, light-leakage current of the thin film transistor can be reduced. In the case where a microcrystalline semiconductor region which is in contact with the gate insulating layer is included in the semiconductor layer, the microcrystalline semiconductor region and a wiring are in contact with each other in the vicinity of the gate insulating layer, and a Schottky junction is formed in the contact region. Then, holes are injected from the contact region to the microcrystalline semiconductor region, which results in generation of off current. Thus, in the thin film transistor of this embodiment, holes injected from the semiconductor layer 133 to the wirings 129a and 129b can be reduced by providing the first oxide region 125a and the second oxide region 125b or 125c functioning as a barrier region, particularly the first oxide region 125a having a high insulating property, between the semiconductor layer 133 including the microcrystalline semiconductor region 133a and the wirings 129a and 129b; accordingly, the off current of the thin film transistor can be reduced. As described above, a thin film transistor with low light-leakage current and low off current can be obtained.

Figure 3:
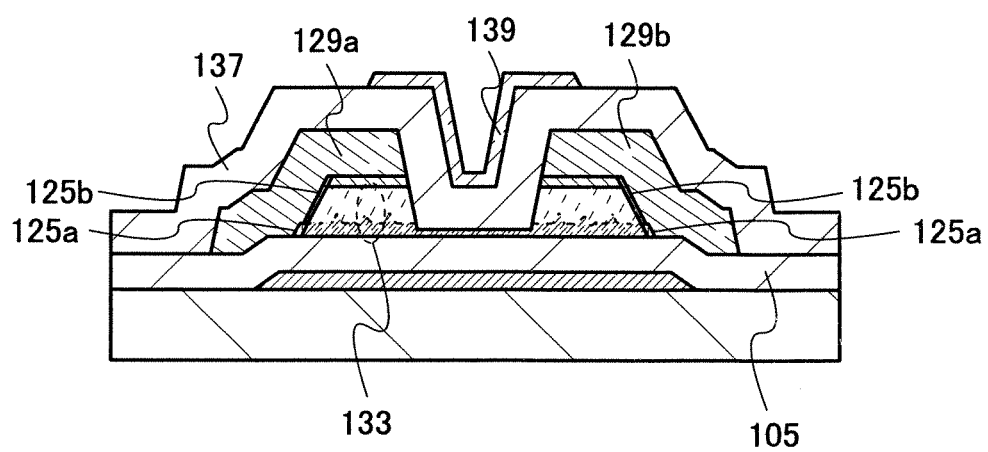
FIG. 3 is a cross-sectional view illustrating a thin film transistor according to one embodiment of the present invention.

A thin film transistor illustrated in FIG. 3 is a dual-gate thin film transistor, which includes the insulating layer 137 covering the thin film transistor that has the same structure as that illustrated in FIG. 1A and an electrode which is over the insulating layer 137 and overlaps with the semiconductor layer 133. Note that the electrode which faces the semiconductor layer 133 with the insulating layer 137 interposed therebetween is here a back-gate electrode 139. In addition, the first oxide region 125a and the second oxide region 125b are provided between the semiconductor layer 133 and the wirings 129a and 129b.

In the dual-gate thin film transistor, electrical potential applied to the gate electrode 103 and electrical potential applied to the back-gate electrode 139 can be different from each other. Thus, the threshold voltage of the thin film transistor can be controlled. Alternatively, the gate electrode 103 and the back-gate electrode 139 can be supplied with the same level of electrical potential. Thus, channels are formed in the vicinity of both of the first surface and the second surface of the microcrystalline semiconductor region 133a.

In the dual-gate thin film transistor described in this embodiment, two channels where carriers flow are formed in the vicinity of the interface between the microcrystalline semiconductor region 133a and the gate insulating layer 105 and in the vicinity of the interface between the microcrystalline semiconductor region 133a and the insulating layer 137. Thus, the amount of transferring carriers is increased, and the on current and the field-effect mobility can be increased. In addition, the first region 125a and the second insulating region 125b that are barrier regions are provided between the semiconductor layer 133 and the wirings 129a and 129b, whereby holes injected from the semiconductor layer 133 to the wirings 129a and 129b can be reduced. As a result, a thin film transistor with low of current, high field-effect mobility, high on current, and extremely high on/off ratio can be provided. Therefore, the size of the thin film transistor can be decreased, and high integration of a semiconductor device can be achieved. Further, when the thin film transistor described in this embodiment is used for a driver circuit of a display device, the size of the driver circuit can be decreased, which enables the frame of the display device to be narrowed.

Next, components of the thin film transistor are described below.

As the substrate 101, a glass substrate; a ceramic substrate; a plastic substrate which has high heat resistance enough to withstand a process temperature of this manufacturing process; or the like can be used. In the case where a substrate does not need a light-transmitting property, a metal substrate such as a stainless alloy, whose surface is provided with an insulating layer may be used. Note that there is no limitation on the size of the substrate 101. For example, any of a glass substrates of the 3rd to 10th generations which is often used in the field of the above flat panel display can be used.

The gate electrode 103 can be formed as a single layer or a stacked layer using a metal material such as molybdenum, titanium, chromium, tantalum, tungsten, aluminum, copper, neodymium, scandium, or nickel or an alloy material which includes any of these materials as a main component. Further, a semiconductor material typified by polycrystalline silicon that is doped with an impurity element such as phosphorus, an AgPdCu alloy, an aluminum alloy which can reduce contact resistance even when being in direct contact with a light-transmitting conductive oxide semiconductor (such as an Al—Nd alloy, an Al—Ni alloy, an Al—Ni—La alloy, or an Al—Nd—La alloy) may also be used.

For example, the gate electrode 103 preferably has the following two-layer structures: a two-layer structure in which a molybdenum layer is stacked over an aluminum layer; a two-layer structure in which a molybdenum layer is stacked over a copper layer; a two-layer structure in which a titanium nitride layer or a tantalum nitride layer is stacked over a copper layer; a two-layer structure of a titanium nitride layer and a molybdenum layer; a two-layer structure of an alloy layer including copper, magnesium, and oxygen and a copper layer; a two-layer structure of an alloy layer including copper, manganese, and oxygen and a copper layer; a two-layer structure of an alloy layer including copper and manganese and a copper layer; and the like. Alternatively, a three-layer structure in which a tungsten layer or a tungsten nitride layer, an aluminum-silicon alloy layer or an aluminum-titanium alloy layer, and a titanium nitride layer or a titanium layer are stacked is preferably used. When a metal layer functioning as a barrier layer is stacked over a layer with low electric resistance, electric resistance can be reduced and diffusion of metal elements from the metal layer into the semiconductor layer can be prevented.

The gate insulating layer 105 can be formed as a single layer or a stacked layer using a silicon oxide layer, a silicon nitride layer, a silicon oxynitride layer, or a silicon nitride-oxide layer by a CVD method, a sputtering method, or the like. Further, the gate insulating layer 105 is formed using a silicon oxide layer or a silicon oxynitride layer, so that fluctuation in threshold voltage of the thin film transistor can be decreased.

Note that "silicon oxynitride" means an insulating substance including silicon that contains more oxygen than nitrogen. In the case where measurements are performed using Rutherford backscattering spectrometry (RBS) and hydrogen forward scattering (HFS), silicon oxynitride contains oxygen, nitrogen, silicon, and hydrogen at concentrations ranging from 50 to 70 at. %, 0.5 to 15 at. %, 25 to 35 at. %, and 0.1 to 10 at. %, respectively. Further, "silicon nitride-oxide" means an insulating substance including silicon that contains more nitrogen than oxygen, and in the case where measurements are performed using RBS and HFS, silicon nitride-oxide preferably contains oxygen, nitrogen, silicon, and hydrogen as composition ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride or the silicon nitride-oxide is defined as 100 at. %.

The semiconductor layer 133 has a structure in which the microcrystalline semiconductor region 133a and the amorphous semiconductor region 133b which are divided amorphous semiconductor regions are stacked. In addition, in this embodiment, the microcrystalline semiconductor region 133a has a projected and depressed shape.

Here, a detailed structure of the semiconductor layer 133 is described. The enlarged views of a structure between the gate insulating layer 105 and the impurity semiconductor layer 131a functioning as a source region or a drain region illustrated in FIG. 1A are illustrated in FIG. 4A and FIG. 4B.

Figure 4A:
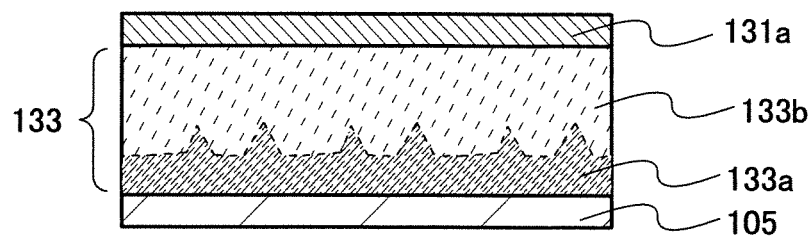
FIGS. 4A and 4B are cross-sectional views each illustrating a thin film transistor according to one embodiment of the present invention.
Figure 4B:
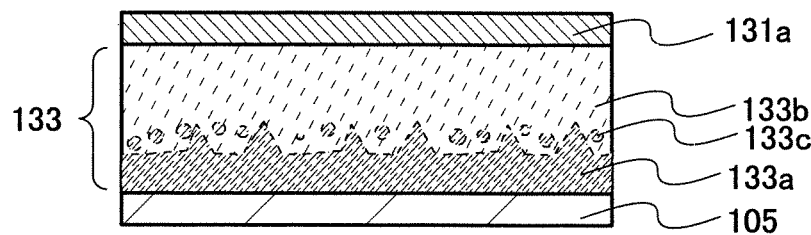

As illustrated in FIG. 4A, the microcrystalline semiconductor region 133a has a projected and depressed shape. The projected portion has a projecting (conical or pyramidal) shape whose width decreases from the gate insulating layer 105 toward the amorphous semiconductor region 133b (a tip of the projected portion has an acute angle). Alternatively, the projected portion may be a projecting (inverted conical or inverted pyramidal) shape whose width increases from the gate insulating layer 105 toward the amorphous semiconductor region 133b.

The microcrystalline semiconductor region 133a is formed using a microcrystalline semiconductor. Note that a microcrystalline semiconductor is a semiconductor having an intermediate structure between amorphous and crystalline structures (including single crystal and polycrystal). A microcrystalline semiconductor is a semiconductor having a third state that is stable in terms of free energy and is a crystalline semiconductor having short-range order and lattice distortion, in which columnar or needle-like crystals having a grain size of from 2 nm to 200 nm, preferably from 10 nm to 80 nm, more preferably from 20 nm to 50 nm have grown in a direction of the normal to the substrate surface. Accordingly, there is a case where crystal grain boundaries are formed at the interface of column-like crystals or needle-like crystals.

The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^1$ which represents amorphous silicon. The microcrystalline semiconductor includes at least 1 at. % or more of hydrogen or halogen to terminate a dangling bond. Moreover, the microcrystalline semiconductor may contain a rare gas element such as helium, argon, krypton, or neon to further promote lattice distortion, so that stability is increased and a favorable microcrystalline semiconductor can be obtained. Such a microcrystalline semiconductor is disclosed in, for example, U.S. Pat. No. 4,409,134.

The thickness of the microcrystalline semiconductor region 133a, that is, the distance from the interface between the microcrystalline semiconductor region 133a and the gate insulating layer 105 to the tip of the projection (projecting portion) of the microcrystalline semiconductor region 133a is set to from 3 nm to 410 nm, preferably from 20 nm to 100 nm, so that the off current of the thin film transistor can be reduced.

Further, it is preferable that the concentration of oxygen and nitrogen contained in the semiconductor layer 133 measured by secondary ion mass spectrometry be lower than $1 \times 10^{18}$ atoms/cm$^3$ because the crystallinity of the microcrystalline semiconductor region 133a can be improved.

The amorphous semiconductor region 133b is formed using an amorphous semiconductor including nitrogen. The nitrogen may exist, for example, as an NH group or an NH$_2$ group. The amorphous semiconductor is formed using amorphous silicon.

The amorphous semiconductor including nitrogen is a semiconductor having lower energy at an Urbach edge measured by a constant photocurrent method (CPM) or photoluminescence spectroscopy and a smaller amount of absorption spectra of the defect level as compared to a conventional amorphous semiconductor. That is, the amorphous semiconductor including nitrogen is a well-ordered semiconductor which has fewer defects and whose tail of a level at a band edge in the valence band is steep, as compared to the conventional amorphous semiconductor. Since the amorphous semiconductor including nitrogen has a steep tail of a level at a band edge in the valence band, the band gap gets wider and tunneling current does not easily flow. Therefore, by providing an amorphous semiconductor including nitrogen on the back channel side, the off current of the thin film transistor can be reduced. In addition, by providing the amorphous semiconductor including nitrogen, the on current and the field-effect mobility of the thin film transistor can be increased.

Further, a peak region of a spectrum obtained by performing low-temperature photoluminescence spectroscopy on the amorphous semiconductor including nitrogen is 1.31 eV to 1.39 eV inclusive. Note that a peak region of a spectrum obtained by performing low-temperature photoluminescence spectroscopy on a microcrystalline semiconductor, typically a microcrystalline silicon, is 0.98 eV to 1.02 eV inclusive. Accordingly, the amorphous semiconductor including nitrogen is different from a microcrystalline semiconductor.

In addition to the amorphous semiconductor region 133b, an NH group or an NH$_2$ group may also be included in the microcrystalline semiconductor region 133a.

Further, as illustrated in FIG. 4B, when semiconductor crystal grains 133c whose grain size is 1 nm to 10 nm inclusive, preferably 1 nm to 5 nm inclusive are dispersedly included in the amorphous semiconductor region 133b, on current and filed-effect mobility can be increased.

A microcrystalline semiconductor having a projected (conical or pyramidal) shape whose width decreases from the gate insulating layer 105 toward the amorphous semiconductor region 133b or a microcrystalline semiconductor having a projected shape whose width increases from the gate insulating layer 105 toward the amorphous semiconductor region 133b is formed in the following manner. A microcrystalline semiconductor layer is formed under the condition that a microcrystalline semiconductor is deposited, and after that, the crystal is grown under the condition that the crystal grow is gradually reduced and an amorphous semiconductor is deposited.

Since the microcrystalline semiconductor region of the semiconductor layer 133 in the thin film transistor described in this embodiment has a conical or pyramidal shape or an inverted conical or pyramidal shape, resistance in the vertical direction (thickness direction), i.e., resistance of the semiconductor layer 133, of when the voltage is applied between the source and drain electrodes in an on state can be reduced. Further, tunneling current does not easily flow by provision of the amorphous semiconductor including nitrogen between the microcrystalline semiconductor region and the impurity semiconductor layer because the amorphous semiconductor including nitrogen is a well-ordered semiconductor which has fewer defects and whose tail of a level at a band edge in the valence band is steep. Thus, in the thin film transistor described in this embodiment, the on current and the field-effect mobility can be increased and the off current can be reduced; thus, the on/off ratio becomes extremely high.

The impurity semiconductor layers 131a and 131b are formed using amorphous silicon to which phosphorus is added, microcrystalline silicon to which phosphorus is added, or the like. Alternatively, the impurity semiconductor layers 131a and 131b can have a stacked structure of amorphous silicon to which phosphorus is added and microcrystalline silicon to which phosphorus is added. Note that, in the case of forming a p-channel thin film transistor as a thin film transistor, the impurity semiconductor layers 131a and 131b are formed using microcrystalline silicon to which boron is added, amorphous silicon to which boron is added, or the like. Note that when the ohmic contact is formed between the semiconductor layer 133 and the wirings 129a and 129b, the impurity semiconductor layers 131a and 131b are not necessarily formed.

Further, in the case where the impurity semiconductor layers 131a and 131b are formed using microcrystalline silicon to which phosphorus is added or microcrystalline silicon to which boron is added, a microcrystalline semiconductor layer, typically a microcrystalline silicon layer, is formed between the semiconductor layer 133 and the impurity semiconductor layers 131a and 131b, so that characteristics of the interference can be improved. As a result, resistance generated at the interface between the semiconductor layer 133 and the impurity semiconductor layers 131a and 131b can be reduced. Therefore, the amount of current flowing through the source region, the semiconductor layer, and the drain region of the thin film transistor can be increased and the on current and the field effect mobility can be increased.

The wirings 129a and 129b can be formed as a single layer or a stacked layer using any of aluminum, copper, titanium, neodymium, scandium, molybdenum, chromium, tantalum, manganese, magnesium, zirconium, vanadium, nickel, tungsten, and the like. Alternatively, an aluminum alloy which can reduce the contact resistance even when being in direct contact with a light-transmitting conductive oxide semiconductor (such as an Al—Nd alloy, an Al—Ni alloy, an Al—Ni—La alloy, or an Al—Nd—La alloy, or the like) may be used. Further alternatively, crystalline silicon to which an impurity element which serves as a donor is added may be used. Furthermore, the wirings 129a and 129b may have a stacked structure obtained as follows: a layer, which is stacked over the crystalline silicon to which an impurity element serving as a donor is added, is formed using titanium, tantalum, molybdenum, tungsten, or nitride of any of these elements, and then an aluminum or an aluminum alloy is formed thereover. Moreover, the wirings 129a and 129b may have a stacked structure in which an upper side and a lower side of an aluminum or an aluminum alloy are covered with titanium, tantalum, molybdenum, tungsten, or nitride of any of these elements.

The insulating layer 137 can be formed in a manner similar to that for the gate insulating layer 105. Alternatively, the insulating layer 137 can be formed using an organic resin layer. Examples of the organic resin layer include acrylic, epoxy, polyimide, polyamide, polyvinylphenol, and benzocyclobutene. Alternatively, a siloxane polymer can be used.

The back-gate electrode 139 illustrated in FIG. 3 can be formed in a manner similar to that of the wirings 129a and 129b. Alternatively, the back-gate electrode 139 can be formed using a light-transmitting conductive oxide semiconductor. Typical examples of the light-transmitting conductive oxide semiconductor include indium oxide including tungsten oxide, indium zinc oxide including tungsten oxide, indium oxide including titanium oxide, indium tin oxide including titanium oxide, indium tin oxide, indium zinc oxide, and indium tin oxide to which silicon oxide is added.

Alternatively, the back-gate electrode 139 can be formed using a conductive composition containing a light-transmitting conductive macromolecule (also referred to as a "conductive polymer"). The back-gate electrode 139 preferably has a sheet resistance of less than or equal to 10000 ohms/square and a light transmittance of greater than or equal to 70% at a wavelength of 550 nm. Further, the resistivity of the conductive macromolecule included in the conductive composition is preferably less than or equal to 0.1 Ω·cm.

As the conductive macromolecule, a so-called π-electron conjugated conductive macromolecule can be used. For example, polyaniline and/or a derivative thereof, polypyrrole and/or a derivative thereof, polythiophene and/or a derivative thereof, and a copolymer of two or more of aniline, pyrrole, and thiophene and/or a derivative thereof can be given.

Next, a form of the back-gate electrode is described with reference to FIGS. 5A to 5C that are top views of the thin film transistors.

Figure 5A:
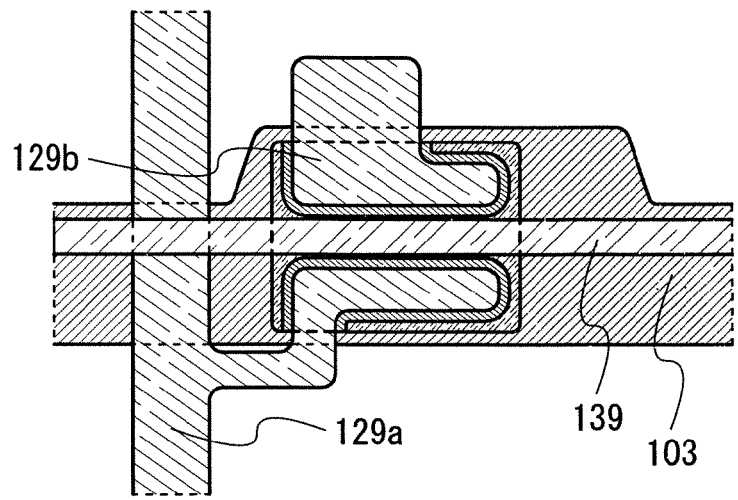
FIGS. 5A to 5C are top views each illustrating a thin film transistor according to one embodiment of the present invention.

As illustrated in FIG. 5A, the back-gate electrode 139 can be formed in parallel to the gate electrode 103. In this case, each of electrical potential applied to the back-gate electrode 139 and electrical potential applied to the gate electrode 103 can be controlled independently each other. Thus, a threshold voltage of the thin film transistor can be controlled.

Figure 5B:
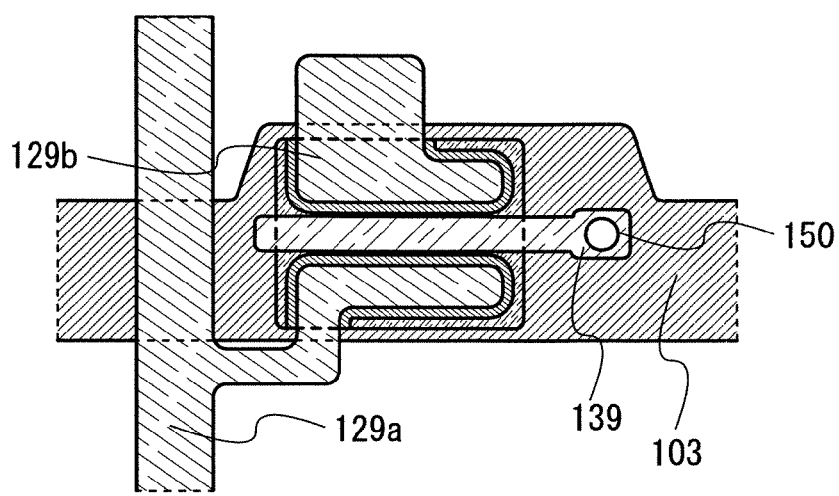

As illustrated in FIG. 5B, the back-gate electrode 139 can be connected to the gate electrode 103. That is, the gate electrode 103 and the back-gate electrode 139 can be connected through an opening 150 formed in the gate insulating layer 105 and the insulating layer 137. In this case, electrical potential applied to the back-gate electrode 139 and electrical potential applied to the gate electrode 103 are equivalent. As a result, in the microcrystalline semiconductor region in the semiconductor layer, regions where carriers flow, that is, channels are formed on the gate insulating layer 105 side and on the insulating layer 137 side. Thus, the on current of the thin film transistor can be increased.

Figure 5C:
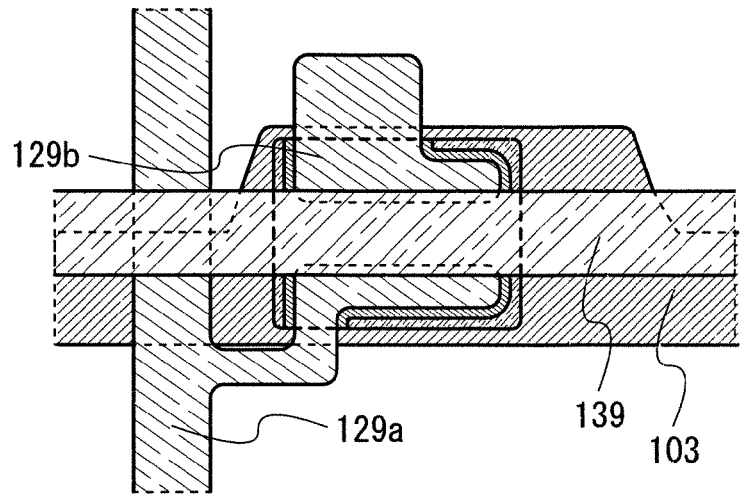

As illustrated in FIG. 5C, the back-gate electrode 139 may overlap with the wirings 129a and 129b with the insulating layer 137 interposed therebetween. Here, FIG. 5C illustrates an example in which the back-gate electrode 139 of FIG. 5A is made to overlap with the wirings 129a and 129b. However, the back-gate electrode 139 of FIG. 5B may be made to overlap with the wirings 129a and 129b, which may be employed for FIG. 5C.

In the thin film transistor described in this embodiment, the first oxide region and the second oxide region each of which functions as a barrier region are provided between the wiring and the semiconductor layer which includes a microcrystalline semiconductor region and an amorphous semiconductor region. Further, the microcrystalline semiconductor region included in the semiconductor layer is in contact with the gate insulating layer, and the amorphous semiconductor region in the semiconductor layer includes nitrogen, which is formed using a well-ordered semiconductor layer having fewer defects and a steep tail of a level at a band edge in the valence band. Further, the semiconductor layer has a smaller area than the gate electrode, and the whole semiconductor layer overlaps with the gate electrode, and thereby light from the substrate side can be blocked by the gate electrode. Thus, carriers injected from the microcrystalline semiconductor layer with a small band gap to the wiring can be reduced on the condition that the light off current generated in the semiconductor layer is decreased; accordingly, the off current can be reduced sufficiently in an environment of practical usage. As a result, a thin film transistor with an extremely high on/off ratio can be manufactured with high productively. When the thin film transistor is used for switching of a pixel in a display device, the area of a capacitor can be reduced. Therefore, the display device can achieve high aperture ratio, high contrast, high response time, and low power consumption. Further, since the size of the thin film transistor can be decreased, when a driver circuit is manufactured using this thin film transistor, the frame of the display device can be narrowed.

(Embodiment 2)

In this embodiment, a case where the wirings 129a and 129b described in Embodiment 1 are formed using a metal element with high oxygen affinity will be described with reference to FIGS. 6A and 6B.

Figure 6A:
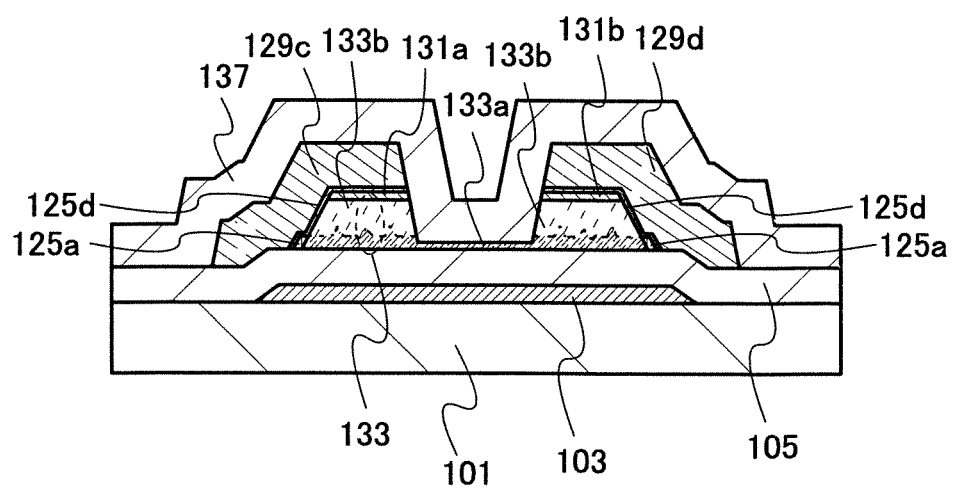
FIGS. 6A and 6B are cross-sectional views each illustrating a thin film transistor according to one embodiment of the present invention.

A thin film transistor illustrated in FIG. 6A includes, over the substrate 101, the gate electrode 103, the semiconductor layer 133, the gate insulating layer 105 provided between the gate electrode 103 and the semiconductor layer 133, the impurity semiconductor layers 131a and 131b which are in contact with the semiconductor layer 133 and function as a source region and a drain region, and wirings 129c and 129d which are in contact with the impurity semiconductor layers 131a and 131b and formed using a metal element with high oxygen affinity. The semiconductor layer 133 has a smaller area than the gate electrode 103, and the whole semiconductor layer 133 overlaps with the gate electrode 103. Further, an oxide region is provided on the side of the semiconductor layer 133, that is, between the semiconductor layer 133 and the wirings 129c and 129d. Specifically, the first oxide region 125a is formed between the microcrystalline semiconductor region 133a of the semiconductor layer 133 and the wirings 129c and 129d, and a second oxide region 125d is formed between the amorphous semiconductor region 133b of the semiconductor layer 133 and the wirings 129c and 129d and between the first oxide region 125a and the wirings 129e and 129d. Furthermore, the insulating layer 137 may be provided to cover the semiconductor layer 133, the impurity semiconductor layers 131a and 131b, and the wirings 129c and 129d of the thin film transistor.

The wirings 129c and 129d are formed using a metal element with high oxygen affinity. Examples of the metal with high oxygen affinity include titanium, aluminum, manganese, magnesium, molybdenum, zirconium, vanadium, nickel, and the like. Furthermore, the preferable metal with high oxygen affinity is the metal whose oxide functions as a semiconductor, typically, titanium, nickel, vanadium, or the like.

Figure 6B:
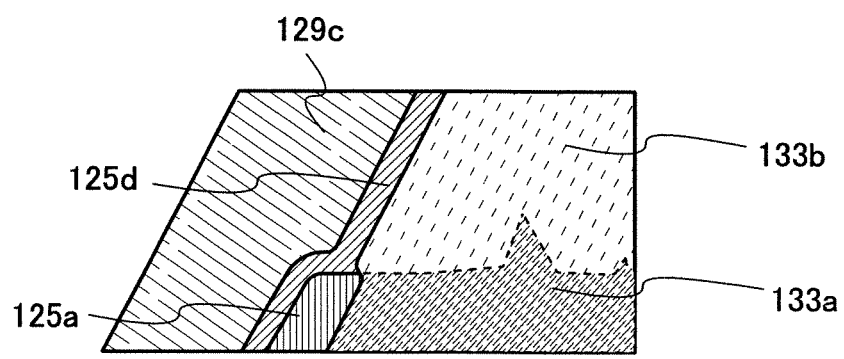

FIG. 6B is a schematic view which illustrates the enlarged vicinity between the semiconductor layer 133 and the wiring 129c of FIG. 6A. The first oxide region 125a formed on the side of the microcrystalline semiconductor region 133a is formed by oxidizing a part of the microcrystalline semiconductor region 133a and is typically formed of a semiconductor oxide. Examples of the semiconductor oxide include silicon oxide, silicon oxynitride, and the like. The semiconductor oxide included in the first oxide region 125a does not necessarily satisfy the stoichiometric proportion.

The second oxide region 125d formed on the side of the amorphous semiconductor region 133b is formed of oxide of an element included in the wiring 129c, typically titanium oxide, aluminum oxide, manganese oxide, magnesium oxide, molybdenum oxide, zirconium oxide, vanadium oxide, nickel oxide, or the like. Since the wiring 129c is formed using a metal element with high oxygen affinity, oxygen in the semiconductor oxide formed on the side of the amorphous semiconductor region 133b transfers toward the wiring 129c side, whereby the second oxide region 125d is formed. Further, oxygen in the first oxide region 125a formed on the side of the microcrystalline semiconductor region 133a transfers to the wirings 129c and 129d, whereby the second oxide region 125d is formed also between the first oxide region 125a and the wiring 129c.

Note that the second oxide region 125d is also formed between the impurity semiconductor layer 131a and the wiring 129c and between the impurity semiconductor layer 131b and the wiring 129d. In the process for formation of the impurity semiconductor layers 131a and 131b, etching is performed with use of a resist mask, and the resist mask is removed after the etching. In the removal step, a thin oxide region is formed on the surfaces of the impurity semiconductor layers 131a and 131b. The thin oxide region and the wirings 129c and 129d are in contact with each other, whereby the second oxide region is formed. Note that the second oxide region 125d which is formed of semiconductor oxide such as titanium oxide, nickel oxide, or vanadium oxide is unlikely to function as a resistance component between the impurity semiconductor layer 131a and the wiring 129c and between the impurity semiconductor layer 131b and the wiring 129d; accordingly, electric characteristics of the thin film transistor can be prevented from being reduced.

In the thin film transistor described in this embodiment, the first oxide region and the second oxide region each of which functions as a barrier region are provided between the wiring and the semiconductor layer including a microcrystalline semiconductor region. Further, the microcrystalline semiconductor region included in the semiconductor layer is in contact with the gate insulating layer, and the amorphous semiconductor region in the semiconductor layer includes nitrogen, which is formed using a well-ordered semiconductor layer having fewer defects and a steep tail of a level at a band edge in the valence band. Further, the semiconductor layer has a smaller area than the gate electrode, and the whole semiconductor layer overlaps with the gate electrode, and thereby light from the substrate side can be blocked by the gate electrode. Thus, carriers injected from the microcrystalline semiconductor layer with a small band gap to the wiring can be reduced on the condition that the light off current generated in the semiconductor layer is decreased; accordingly, the off current can be reduced sufficiently in an environment of practical usage. As a result, a thin film transistor with an extremely high on/off ratio can be manufactured with high productively. When the thin film transistor is used for switching of a pixel in a display device, the area of a capacitor can be reduced. Therefore, the display device can achieve high aperture ratio, high contrast, high response time, and low power consumption. Further, since the size of the thin film transistor can be decreased, when a driver circuit is manufactured using this thin film transistor, the frame of the display device can be narrowed.

(Embodiment 3)

In this embodiment, a thin film transistor having a structure different from that of Embodiment 1 will be described with reference to FIGS. 7A and 7B. A difference between this embodiment and Embodiment 1 is in the structure of the semiconductor layer.

Figure 7A:
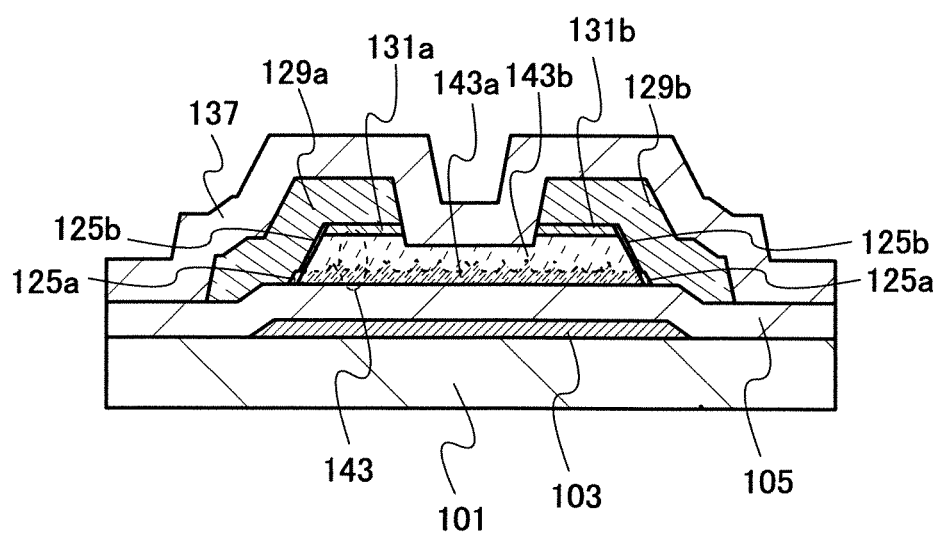
FIGS. 7A and 7B are cross-sectional views each illustrating a thin film transistor according to one embodiment of the present invention.

A thin film transistor illustrated in FIG. 7A includes, over the substrate 101, the gate electrode 103, a semiconductor layer 143, the gate insulating layer 105 provided between the gate electrode 103 and the semiconductor layer 143, the impurity semiconductor layers 131a and 131b which are in contact with the semiconductor layer 143 and function as a source region and a drain region, and the wirings 129a and 129b which are in contact with the impurity semiconductor layers 131a and 131b. In addition, an oxide region functioning as a barrier region is provided on the side of the semiconductor layer 143, that is, between the semiconductor layer 143 and the wirings 129a and 129b. Specifically, the first oxide region 125a is formed between a microcrystalline semiconductor region 143a and the wirings 129a and 129b, and the second oxide region 125b is formed between an amorphous semiconductor region 143b and the wirings 129a and 129b. Furthermore, the insulating layer 137 may be provided to cover the semiconductor layer 143, the impurity semiconductor layers 131a and 131b, and the wirings 129c and 129d.

The semiconductor layer 143 includes the microcrystalline semiconductor region 143a and the amorphous semiconductor region 143b. The microcrystalline semiconductor region 143a has a surface which is in contact with the gate insulating layer 105 (hereinafter, referred to as a first surface of the microcrystalline semiconductor region 143a in this embodiment) and a surface which faces the first surface of the microcrystalline semiconductor region 143a and is in contact with the amorphous semiconductor region 143b (hereinafter, referred to as a second surface of the microcrystalline semiconductor region 143a in this embodiment). The amorphous semiconductor region 143b has a surface which is in contact with the microcrystalline semiconductor region 143a (hereinafter, referred to as a first surface of the amorphous semiconductor region 143b in this embodiment) and a surface which faces the first surface of the amorphous semiconductor region 143b and is in contact with the pair of impurity semiconductor layers 131a and 131b and the insulating layer 137 (hereinafter, referred to as a second surface of the amorphous semiconductor region 143b in this embodiment). The semiconductor layer 143 has a smaller area than the gate electrode 103, and the whole semiconductor layer 143 overlaps with the gate electrode 103.

Figure 8:
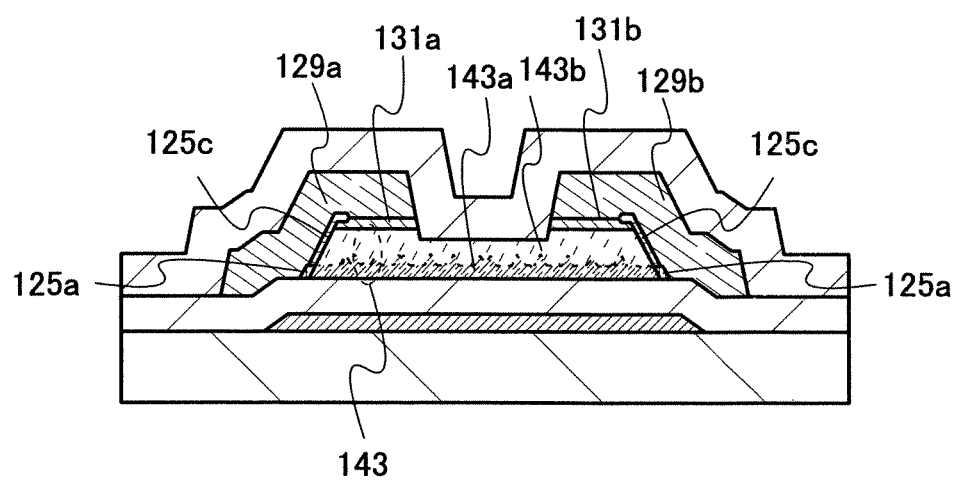
FIG. 8 is a cross-sectional view illustrating a thin film transistor according to one embodiment of the present invention.

As illustrated in FIG. 8, the oxide region may include the first oxide region 125a formed on the side of the microcrystalline semiconductor region 143a and the second oxide region 125c formed not only on the side of the amorphous semiconductor region 143b but also on the side and the part of the surface of the pair of the impurity semiconductor layers 131a and 131b.

Figure 7B:
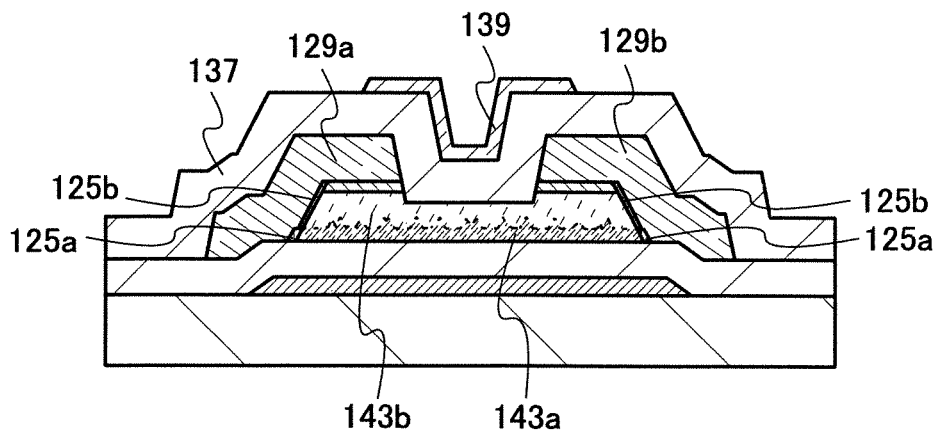

A thin film transistor illustrated in FIG. 7B is a dual-gate thin film transistor, which includes the insulating layer 137 covering the thin film transistor that has the same structure as that illustrated in FIG. 7A and the back-gate electrode 139 which is over the insulating layer 137 and overlaps with the semiconductor layer 143. That is in a region of the semiconductor layer 143 which overlaps with the gate electrode 103, the microcrystalline semiconductor region 143a is in contact with the gate insulating layer 105 which is in contact with the gate electrode 103, and the amorphous semiconductor region 143b is in contact with the insulating layer 137 which is in contact with the back-gate electrode 139. In addition, the first oxide region 125a and the second oxide region 125b are provided between the wirings 129a and 129b and the semiconductor layer 143.

The microcrystalline semiconductor region 143a is formed using a material similar to that of the microcrystalline semiconductor region 133a described in Embodiment 1. The amorphous semiconductor region 143b is formed using a material similar to that of the amorphous semiconductor region 133b described in Embodiment 1. In this embodiment, the amorphous semiconductor region 143b is not divided, and the first surface of the microcrystalline semiconductor region 143a is in contact with the gate insulating layer 105 and the second surface is in contact with only the amorphous semiconductor region 143b, which is a different point from the thin film transistor described in Embodiment 1.

In the thin film transistor described in this embodiment, the first oxide region and the second oxide region each of which functions as a barrier region are provided between the wiring and the semiconductor layer including a microcrystalline semiconductor region. Further, the microcrystalline semiconductor region included in the semiconductor layer is in contact with the gate insulating layer, and the amorphous semiconductor region in the semiconductor layer includes nitrogen, which is formed using a well-ordered semiconductor layer having fewer defects and a steep tail of a level at a band edge in the valence band. Further, the semiconductor layer has a smaller area than the gate electrode, and the whole semiconductor layer overlaps with the gate electrode, and thereby light from the substrate side can be blocked by the gate electrode. Thus, carriers injected from the microcrystalline semiconductor layer with a small band gap to the wiring can be reduced on the condition that the light off current generated in the semiconductor layer is decreased; accordingly, the off current can be reduced sufficiently in an environment of practical usage. As a result, a thin film transistor with an extremely high on/off ratio can be manufactured with high productively. When the thin film transistor is used for switching of a pixel in a display device, the display device can achieve high aperture ratio and high contrast.

(Embodiment 4)

In this embodiment, a method for manufacturing the thin film transistor illustrated in FIGS. 1A to 1C will be described with reference to FIGS. 9A to 9D, FIGS. 10A to 10D, and FIGS. 11A and 11B. Here, a method for manufacturing an n-channel thin film transistor will be described.

Figure 9A:
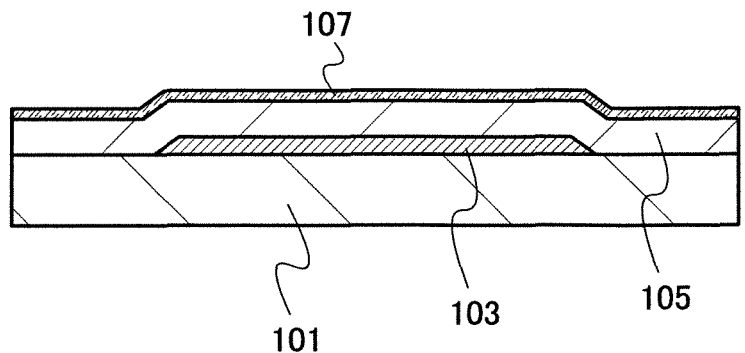
FIGS. 9A to 9D are cross-sectional views illustrating a method for manufacturing a thin film transistor according to one embodiment of the present invention.

As illustrated in FIG. 9A, the gate electrode 103 is formed over the substrate 101. Then, the gate insulating layer 105 is formed so as to cover the gate electrode 103. After that, a microcrystalline semiconductor layer 107 is formed.

As the substrate 101, the substrate 101 described in Embodiment 1 can be used as appropriate.

The gate electrode 103 is formed using a material used for the gate electrode 103 described in Embodiment 1 as appropriate. The gate electrode 103 can be formed in the following manner: a conductive layer is formed over the substrate 101 using the above-described material by a sputtering method or a vacuum evaporation method; a mask is formed over the conductive layer by a photolithography method, an inkjet method, or the like; and the conductive layer is etched using the mask. Further, the gate electrode 103 can be formed by discharging a conductive nanopaste of silver, gold, copper, or the like over the substrate by an inkjet method and baking the conductive nanopaste. In order to improve adhesion between the gate electrode 103 and the substrate 101, a layer of a nitride of any of the aforementioned metal materials may be provided between the substrate 101 and the gate electrode 103. Here, a conductive layer is formed over the substrate 101 and etched with use of a resist mask formed using a photomask, so that the gate electrode 103 is formed.

Note that side surfaces of the gate electrode 103 are preferably tapered. This is because an insulating layer, a semiconductor layer, and a wiring layer, which are formed over the gate electrode 103 in subsequent steps are not disconnected. In order to form the side surfaces of the gate electrode 103 into a tapered shape, etching may be performed while the resist mask is made to recede.

Through the process of forming the gate electrode 103, a gate wiring (a scanning line) and a capacitor wiring can also be formed at the same time. Note that a "scanning line" means a wiring which selects a pixel, while a "capacitor wiring" means a wiring which is connected to one of electrodes of a storage capacitor in a pixel. However, without limitation thereto, the gate electrode 103 and one of or both a gate wiring and a capacitor wiring may be formed separately.

The gate insulating layer 105 can be formed by a CVD method, a sputtering method, or the like using the material given in Embodiment 1. In a process of forming the gate insulating layer 105 by a CVD method, glow discharge plasma is generated by applying high-frequency power with a frequency of 3 MHz to 30 MHz, typically 13.56 MHz or 27.12 MHz, or high-frequency power in the VHF band with a frequency of 30 MHz to about 300 MHz, typically 60 MHz. Alternatively, glow discharge plasma is generated by applying high frequency power at a microwave frequency of 1 GHz or higher. With the use of high-frequency power in the VHF band or with a microwave frequency, the deposition rate can be increased. Note that the high-frequency power can be applied in a pulsed manner or a continuous manner. In addition, by superimposing high-frequency power in the HF band and high-frequency power in the VHF band on each other, unevenness of plasma in a large-sized substrate is also reduced, so that uniformity can be improved and the deposition rate can be increased. When the gate insulating layer 105 is formed at a high frequency (1 GHz or higher) using a microwave plasma CVD apparatus, the dielectric strength between the gate electrode and the drain and source electrodes can be improved, so that a highly reliable thin film transistor can be obtained.

Further, when a silicon oxide layer is formed as the gate insulating layer 105 by a CVD method using an organosilane gas, the crystallinity of the semiconductor layer which is formed later can be improved, so that the on current and field-effect mobility of the thin film transistor can be increased. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The microcrystalline semiconductor layer 107 is formed using a microcrystalline semiconductor layer typified by a microcrystalline silicon layer, a microcrystalline silicon-germanium layer, a microcrystalline germanium layer, or the like. It is preferable for the microcrystalline semiconductor layer 107 to have a thickness of 3 nm to 100 nm, and much preferable to have a thickness of 5 nm to 50 nm. In the case where the microcrystalline semiconductor layer 107 is too thin, the on current of the thin film transistor is reduced. In the case where the microcrystalline semiconductor layer 107 is too thick, the off current of the thin film transistor is increased when the thin film transistor operates at a high temperature. The thickness of the microcrystalline semiconductor layer 107 is set to 3 nm to 100 nm, preferably, 5 nm to 50 nm, whereby the on current and the off current of the thin film transistor can be controlled.

In a reaction chamber of the plasma CVD apparatus, the microcrystalline semiconductor layer 107 is formed by glow discharge plasma with use of a mixed gas which includes hydrogen and a deposition gas containing silicon or germanium. Alternatively, the microcrystalline semiconductor layer 107 is formed by glow discharge plasma with a mixture of a deposition gas containing silicon or germanium, hydrogen, and a rare gas such as helium, neon, or krypton. Microcrystalline silicon, microcrystalline silicon-germanium, microcrystalline germanium, or the like is formed using a mixture which is obtained by diluting the deposition gas containing silicon or germanium with hydrogen whose flow rate is 10 to 2000 times, preferably 10 to 200 times that of the deposition gas. The deposition temperature in that case is preferably a room temperature to 300° C., much preferably, 200° C. to 280° C.

As typical examples of the deposition gas containing silicon or germanium, $SiH_4$, $Si_2H_6$, $GeH_4$, and $Ge_2H_6$ are given.

In the case where the gate insulating layer 105 is formed using silicon nitride, at an early stage of deposition of the microcrystalline semiconductor layer 107, an amorphous semiconductor region is likely to be formed. In such a case, crystallinity of the microcrystalline semiconductor layer 107 is low and electric characteristics of the thin film transistor are poor. Therefore, when the gate insulating layer 105 is formed using silicon nitride, the microcrystalline semiconductor layer 107 is preferably deposited under the condition that the dilution rate of the deposition gas containing silicon or germanium is high or under the low temperature condition. Typically, the high dilution rate condition in which the flow rate of hydrogen is 200 to 2000 times, more preferably 250 to 400 times that of the deposition gas containing silicon or germanium is preferable. In addition, the low temperature condition in which the temperature for deposition of the microcrystalline semiconductor layer 107 is 200° C. to 250° C. is preferable. When the high dilution rate condition or the low temperature condition is employed, initial nucleation density is increased, an amorphous component over the gate insulating layer 105 is reduced, and crystallinity of the microcrystalline semiconductor layer 107 is improved. Furthermore, when the surface of the gate insulating layer 105 formed using silicon nitride is oxidized, the adhesion with the microcrystalline semiconductor layer 107 is improved. As the oxidation treatment, exposure to an oxidizing gas, plasma treatment in an oxidation gas, or the like can be given.

A rare gas such as helium, argon, neon, krypton, or xenon is used as a source gas for the microcrystalline semiconductor layer 107, whereby the deposition rate of the microcrystalline semiconductor layer 107 can be increased. Moreover, since the deposition rate is increased, the amount of impurities entered in the microcrystalline semiconductor layer 107 is reduced; thus, the crystallinity of the microcrystalline semiconductor layer 107 can be improved. Accordingly, the on current and field-effect mobility of the thin film transistor are increased and throughput of the thin film transistor can also be increased.

When the microcrystalline semiconductor layer 107 is formed, glow discharge plasma is generated by applying high frequency power of 3 MHz to 30 MHz, typically, high frequency power of 13.56 MHz or 27.12 MHz in the HF band, or high frequency power of approximately 30 MHz to 300 MHz in the VHF band, typically 60 MHz. Alternatively, glow, discharge plasma is generated by applying high frequency power at a microwave frequency of 1 GHz or higher. Note that the high-frequency power can be applied in a pulsed manner or a continuous manner. In addition, by superimposing high-frequency power in the HF band and high-frequency power in the VHF band on each other, unevenness of plasma in a large-sized substrate is also reduced, so that uniformity can be improved and the deposition rate can be increased.

Note that before the microcrystalline semiconductor layer 107 is formed, impurities in a treatment chamber of the CVD apparatus are removed by evacuation of the treatment chamber and introduction of a deposition gas containing silicon or germanium, so that the amount of the impurities in the gate insulating layer 105 and the microcrystalline semiconductor layer 107 of the thin film transistor, which is formed later, can be reduced, which enables an improvement in electric characteristics of the thin film transistor. Further, before the microcrystalline semiconductor layer 107 is formed, plasma is generated in an atmosphere containing fluorine such as a fluorine atmosphere, a nitrogen fluoride atmosphere, or a silane fluoride atmosphere, and the gate insulating layer 105 is exposed to the fluorine plasma, whereby the dense microcrystalline semiconductor layer 107 can be formed.

Figure 9B:
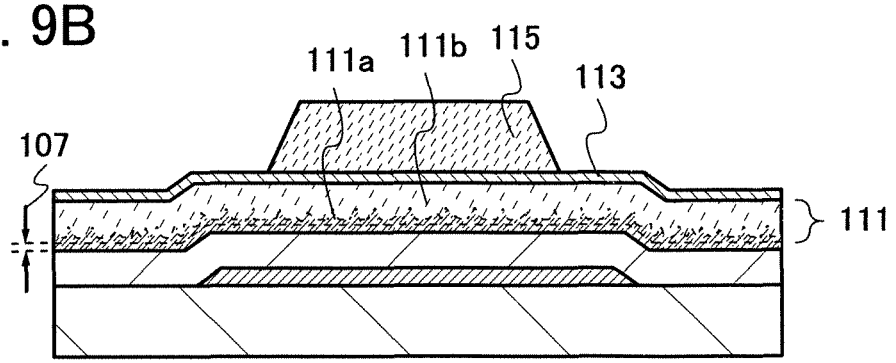

Next, as illustrated in FIG. 9B, a semiconductor layer 111 is formed over the microcrystalline semiconductor layer 107. The semiconductor layer 111 includes a microcrystalline semiconductor region 111a and an amorphous semiconductor region 111b. Next, an impurity semiconductor layer 113 is formed over the semiconductor layer 111. Then, a resist mask 115 is formed over the impurity semiconductor layer 113.

The semiconductor layer 111 including the microcrystalline semiconductor region 111a and the amorphous semiconductor region 111b can be formed under such a condition that crystal growth is partly conducted (the crystal grow is reduced) with use of the microcrystalline semiconductor layer 107 as a seed crystal.

In the treatment chamber of the plasma CVD apparatus, the semiconductor layer 111 is formed by glow discharge plasma with use of a mixed gas which includes a deposition gas containing silicon or germanium, hydrogen, and a gas containing nitrogen. Examples of the gas containing nitrogen include ammonia, nitrogen, nitrogen fluoride, nitrogen chloride, chloroamine, fluoroamine, and the like. Glow discharge plasma can be generated as in the case of the microcrystalline semiconductor layer 107.

In this case, a flow ratio of the deposition gas containing silicon or germanium to hydrogen is the same as that for forming a microcrystalline semiconductor layer 107, and a gas containing nitrogen is used for the source gas, whereby crystal growth can be reduced as compared to the deposition condition of the microcrystalline semiconductor layer 107. Specifically, since a gas containing nitrogen is included in the source gas, the crystal growth is partly reduced at an early stage of deposition of the semiconductor layer 111; therefore, a conical or pyramidal microcrystalline semiconductor region grows, and an amorphous semiconductor region is formed. Furthermore, in the middle stage or later stage of deposition, the crystal growth of the conical or pyramidal microcrystalline semiconductor region is stopped, and only the amorphous semiconductor region is deposited. As a result, in the semiconductor layer 111, the microcrystalline semiconductor region 111a and the amorphous semiconductor region 111b which is formed using a well-ordered semiconductor layer having fewer defects and a steep tail of a level at a band edge in the valence band, can be formed.

Here, a typical example of a condition for forming the semiconductor layer 111 is as follows. The flow rate of hydrogen is 10 to 2000 times, preferably, 10 to 200 times that of the deposition gas containing silicon or germanium. Note that in a typical example of a normal condition for forming an amorphous semiconductor layer, the flow rate of hydrogen is 5 times or less that of the deposition gas containing silicon or germanium.

A rare gas such as helium, neon, argon, krypton, or xenon is introduced into the source gas of the semiconductor layer 111, whereby the deposition rate of the semiconductor layer 111 can be increased.

It is preferable for the semiconductor layer 111 to have a thickness of 50 nm to 350 nm, and further preferable to have a thickness of 120 nm to 250 nm.

Here, the semiconductor layer 111 including the microcrystalline semiconductor region 111a and the amorphous semiconductor region 111b is formed with use of a source gas of the semiconductor layer 111, which includes a gas containing nitrogen. Alternatively, the semiconductor layer 111 is formed with use of a source gas which includes hydrogen and a deposition gas containing silicon or germanium after nitrogen is adsorbed on the surface of the microcrystalline semiconductor layer 107 by exposing the surface of the microcrystalline semiconductor layer 107 to a gas containing nitrogen. Accordingly, the semiconductor layer 111 including the microcrystalline semiconductor region 111a and the amorphous semiconductor region 111b can be formed.

The impurity semiconductor layer 113 is formed by glow discharge plasma with a mixture of a deposition gas containing silicon, hydrogen, and phosphine (diluted with hydrogen or silane) in the reactive chamber of the plasma CVD apparatus. Amorphous silicon to which phosphorus is added or microcrystalline silicon to which phosphorus is added is formed by diluting the deposition gas containing silicon with hydrogen. In the case of manufacturing a p-channel thin film transistor, the impurity semiconductor layer 113 may be formed by glow discharge plasma using diborane instead of phosphine.

The resist mask 115 can be formed by a photolithography step.

Next, with use of the resist mask 115, the microcrystalline semiconductor layer 107, the semiconductor layer 111, and the impurity semiconductor layer 113 are etched. Through this step, the microcrystalline semiconductor layer 107, the semiconductor layer 111, and the impurity semiconductor layer 113 are divided for each element to form a semiconductor layer 117 and an impurity semiconductor layer 121. Note that the semiconductor layer 117 is formed using the microcrystalline semiconductor layer 107 and the semiconductor layer 111 and includes a microcrystalline semiconductor region 117a and an amorphous semiconductor region 117b.

The semiconductor layer 117 divided for each element preferably has a tapered shape. The taper angle of the semiconductor layer 117 is preferably equal to or greater than 45° and equal to or less than 80°. When the semiconductor layer 117 is processed to have the above taper angle, the side of the semiconductor layer is more likely to be exposed to plasma, and the oxide region can be easily formed.

Figure 9C:
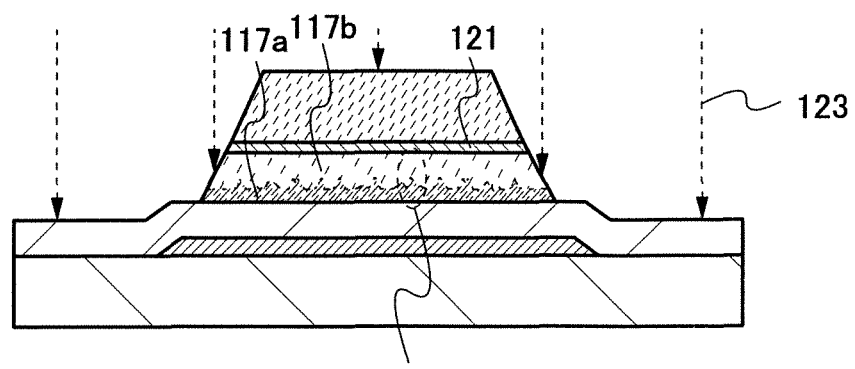

Then, plasma treatment is performed in the state where the resist mask 115 is left so that the side surfaces of the semiconductor layer 117 are exposed to plasma 123 (see FIG. 9C). Here, plasma is generated in an oxidation gas atmosphere, and the semiconductor layer 117 is exposed to the plasma 123. Examples of the oxidation gas include oxygen, ozone, dinitrogen monoxide, water vapor, a mixed gas of oxygen and hydrogen, and the like. Generation of plasma in an oxidation gas causes an oxygen radical to be generated. The radical reacts with the semiconductor layer 117, thereby forming the first oxide region 125a and the second oxide region 125b on the side surfaces of the semiconductor layer 117 (see FIG. 9D). Note that instead of irradiation with plasma, irradiation with ultraviolet light may be employed for generation of an oxygen radical or a nitrogen radical.

Figure 11A:
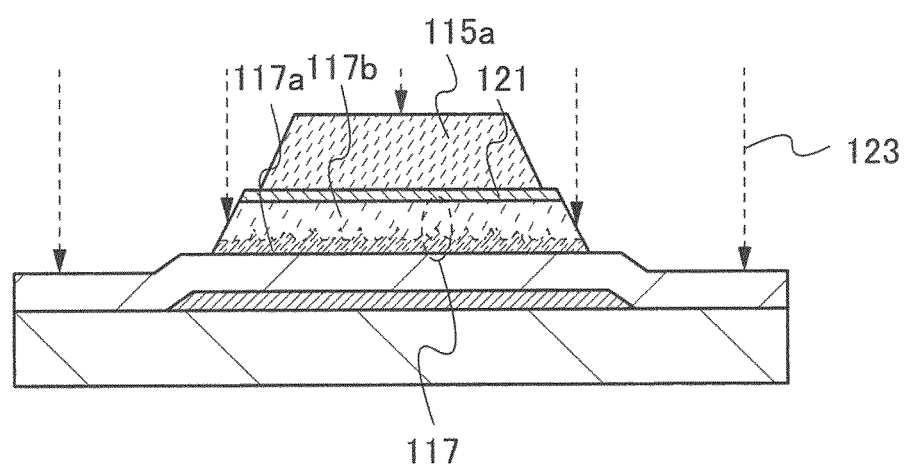
FIGS. 11A and 11B are cross-sectional views illustrating a method for manufacturing a thin film transistor according to one embodiment of the present invention.
Figure 11B:
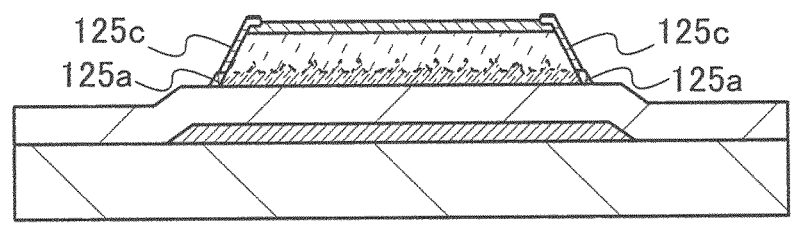

In the case of using oxygen, ozone, water vapor, or a mixed gas of oxygen and hydrogen as the oxidation gas, the resist recedes by plasma irradiation, and a resist mask 115a which is smaller than the resist mask 115 is formed as illustrated in FIG. 11A. Therefore, by the plasma treatment, the exposed impurity semiconductor layer 121 is oxidized together with the side of the semiconductor layer 117. Accordingly, the insulating region functioning as a barrier region, specifically, the first oxide region 125a and the second oxide region 125c, can be formed on the side of the semiconductor-layer 117 and the side and a part of the top surface of the impurity semiconductor layer 121, as illustrated in FIG. 11B. Note that in this step, the resist recedes as little as possible.

Figure 10A:
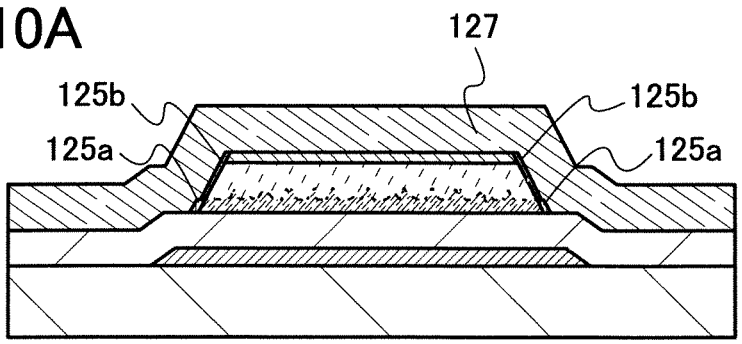
FIGS. 10A to 10D are cross-sectional views illustrating a method for manufacturing a thin film transistor according to one embodiment of the present invention.

Next, a conductive layer 127 is formed over the impurity semiconductor layer 121, the first oxide regions 125a and second oxide region 125b (see FIG. 10A). The conducive layer 127 can be formed using a material similar to that of the wirings 129a and 129b described in Embodiment 1 as appropriate. The conductive layer 127 is formed by a CVD method, a sputtering method, or a vacuum evaporation method. Alternatively, the conductive layer 127 may be formed by discharging a conductive nanopaste of silver, gold, copper, or the like by a screen printing method, an ink-jet method, or the like and baking the conductive nanopaste.

Figure 10B:
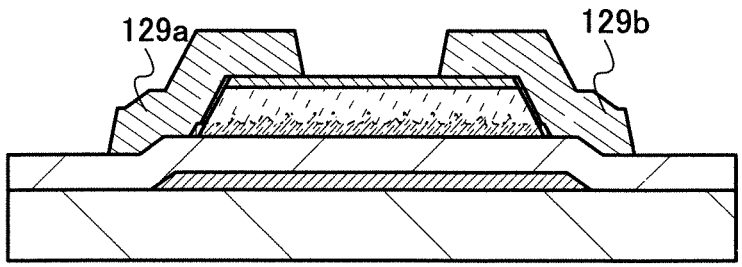
Figure 10C:
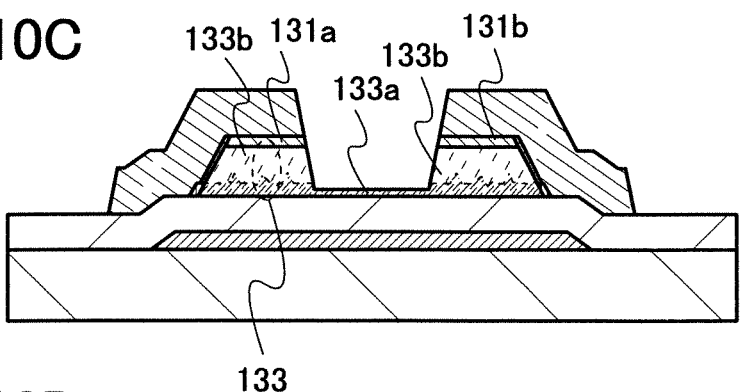
Figure 10D:
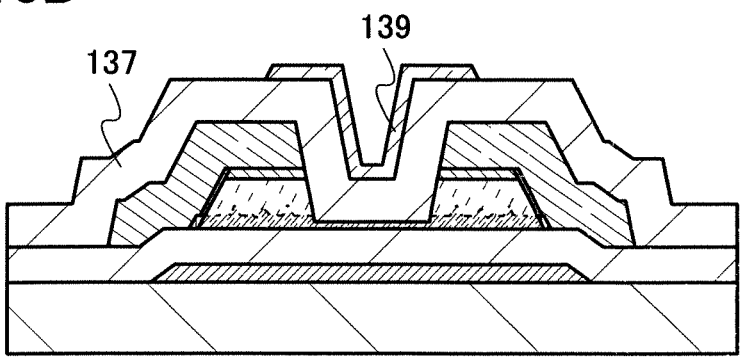

Then, a resist mask is formed by a photolithography step, and the conductive layer 127 is etched with use of the resist mask, so that the wirings 129a and 129b functioning as a source electrode and a drain electrode are formed (see FIG. 10B). The etching of the conductive layer 127 may be either dry etching or wet etching. Note that one of the wirings 129a and 129b functions as a signal line as well as a source electrode or a drain electrode. However, without limitation thereto, a signal line may be provided independently in addition to the source and drain electrodes.

Next, the impurity semiconductor layer 121 and the semiconductor layer 117 are partly etched, so that a pair of the impurity semiconductor layers 131a and 131b functioning as a source and drain regions are formed. Also, the semiconductor layer 133 including the microcrystalline semiconductor region 133a and the pair of amorphous semiconductor regions 133b is formed. At this point, etching of the semiconductor layer 117 is performed so that the microcrystalline semiconductor region 133a is exposed, whereby the semiconductor layer 133 has the following structure. In regions which are covered with the wirings 129a and 129b, the microcrystalline semiconductor region 133a and the amorphous semiconductor region 133b are stacked, and in a region which is not covered with the wirings 129a and 129b but overlaps with the gate electrode 103, the microcrystalline semiconductor region 133a is exposed (see FIG. 10C).

Since dry etching is used in the etching step here, the ends of the wirings 129a and 129b are aligned with ends of the impurity semiconductor layers 131a and 131b. When the conductive layer 127 is subjected to wet etching and the impurity semiconductor layer 121 is subjected to dry etching, the ends of the wirings 129a and 129b and the ends of the impurity semiconductor layers 131a and 131b are not aligned. In a cross section in such a case, the ends of the wirings 129a and 129b are positioned on the inner side than the ends of the impurity semiconductor layers 131a and 131b.

Next, dry etching may be performed. The dry etching is performed with a low etching rates of the microcrystalline semiconductor region 133a and the amorphous semiconductor region 133b so that the exposed microcrystalline semiconductor region 133a and the amorphous semiconductor region 133b are not damaged. In other words, the employed condition is that almost no damage is given the surfaces of the exposed microcrystalline semiconductor region 133a and the amorphous semiconductor region 133b and the thicknesses of the exposed microcrystalline semiconductor region 133a and the amorphous semiconductor region 133b are hardly reduced. As an etching gas, $Cl_2$, $CF_4$, $N_2$, or the like is typically used. There is no particular limitation on an etching method and an inductively coupled plasma (ICP) method, a capacitively coupled plasma (CCP) method, an electron cyclotron resonance (ECR) method, a reactive ion etching (RIE) method, or the like can be used.

Next, the surfaces of the microcrystalline semiconductor region 133a and the amorphous semiconductor region 133b may be subjected to plasma treatment, typically, water plasma treatment, oxygen plasma treatment, ammonia plasma treatment, nitrogen plasma treatment, or the like.

Water plasma treatment can be performed in such a manner that a gas containing water typified by water vapor ($H_2O$ vapor) as a main component is introduced into a reaction space so that plasma is generated. Then, the resist mask is removed. Note that the removal of the resist mask may be performed before the dry etching.

As described above, after the microcrystalline semiconductor region 133a and the amorphous semiconductor region 133b are formed, the dry etching is additionally performed under the condition that no damage is given the microcrystalline semiconductor region 133a and the amorphous semiconductor region 133b, whereby an impurity such as a residual existing over the exposed microcrystalline semiconductor region 133a and the amorphous semiconductor region 133b can be removed. Further, after the dry etching, water plasma treatment is successively performed, whereby a residue of the resist mask can also be removed. By the plasma treatment, insulation between the source region and the drain region can be ensured, and thus, in a thin film transistor which is completed, the off current can be reduced, nonuniformity in electric characteristics can be reduced, and reproducibility in electric characteristics can be reduced.

Through the above steps, a thin film transistor whose channel formation region is formed using a microcrystalline semiconductor, as illustrated in FIG. 1A can be manufactured. Further, a thin film transistor with low off current, high on current, high field-effect mobility, and extremely high on/off ratio can be manufactured with high productivity.

Next, the insulating layer 137 is formed. The insulating layer 137 can be formed in a manner similar to that for the gate insulating layer 105.

Next, an opening (not illustrated) is formed in the insulating layer 137 with use of a resist mask formed by a photolithography step. Then, the back-gate electrode 139 is formed (see FIG. 10D).

The back-gate electrode 139 can be formed in the following manner: a thin film is formed using the materials described in Embodiment 1 by a sputtering method; and the thin film is etched using a resist mask that is formed by a photolithography step. Alternatively, the back-gate electrode 139 can be formed by applying or printing a conductive composition including a conductive macromolecule having a light-transmitting property, and baking the composition.

Through the above steps, the dual-gate thin film transistor as illustrated in FIG. 3 can be manufactured.

Note that this embodiment can be applied to other embodiments.

(Embodiment 5)

In this embodiment, a method for manufacturing the thin film transistor described in Embodiment 3 will be described with reference to FIGS. 9A to 9D and FIGS. 12A and 12B.

In a manner similar to that of Embodiment 4, the gate electrode 103, the gate insulating layer 105, the semiconductor layer 117, the impurity semiconductor layer 121, the first oxide region 125a, the second oxide region 125b, and the wirings 129a and 129b are formed over the substrate 101 through the steps of FIGS. 9A to 9D and FIGS. 10A and 10B.

Next, the impurity semiconductor layer 121 and a part of the semiconductor layer 117 are etched, so that the pair of the impurity semiconductor layers 131a and 131b which function as a source region and a drain region are formed. Also by this etching, the semiconductor layer 143 including the microcrystalline semiconductor region 143a and the amorphous semiconductor region 143b is formed. At this point, etching of the semiconductor layer 117 is performed in such a manner that the amorphous semiconductor region 143b is exposed but the microcrystalline semiconductor region 143a is not exposed. Accordingly, the semiconductor layer 143 in which the first surface of the microcrystalline semiconductor region 143a is in contact with the gate insulating layer 105 and the second surface is in contact with the amorphous semiconductor region 143b is formed (see FIG. 12A).

Through the above steps, the thin film transistor with low off current, high on current, high field-effect mobility, and extremely high on/off ratio, as illustrated in FIG. 7A, can be manufactured.

Figure 12A:
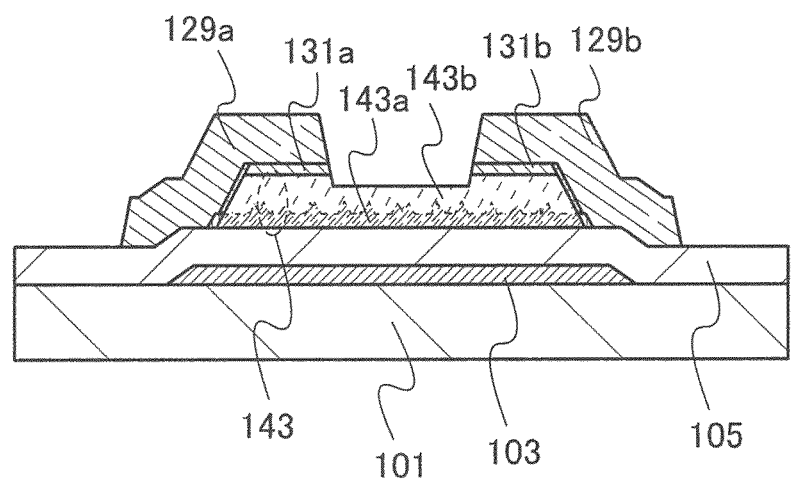
FIGS. 12A and 12B are cross-sectional views illustrating a method for manufacturing a thin film transistor according to one embodiment of the present invention.
Figure 12B:
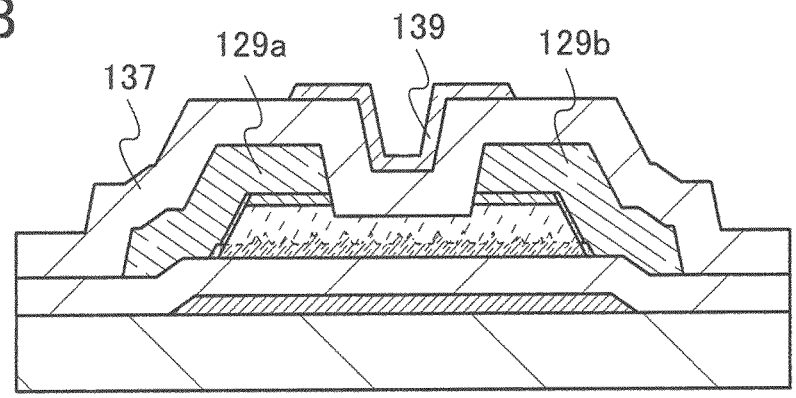

After that, by steps similar to those described in Embodiment 4, the insulating layer 137 and the back-gate electrode 139 are formed (see FIG. 12B). Through the above steps, the thin film transistor with low off current, high on current, high field-effect mobility, and extremely high on/off ratio, as illustrated in FIG. 7B, can be manufactured.

Note that this embodiment can be applied to Other embodiments.

(Embodiment 6)

A thin film transistor is manufactured, and a semiconductor device having a display function (also referred to as a display device) can be manufactured using the thin film transistor in a pixel portion and further in a driver circuit. Further, part or whole of a driver circuit using a thin film transistor can be formed over the same substrate as a pixel portion, using a thin film transistor, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC and the like including a controller are mounted on the panel. Furthermore, an element substrate, which corresponds to one embodiment before the display element is completed in a manufacturing process of the display device, is provided with a component for supplying current to the display element in each of a plurality of pixels. Specifically, the element substrate may be in a state in which only a pixel electrode of the display element is provided, a state after formation of a conductive film to be a pixel electrode and before etching of the conductive film to form the pixel electrode, or any other states.

Note that a display device in this specification means an image display device, a display device, or a light source (including a lighting device). Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

(Embodiment 7)

A semiconductor device disclosed in this specification can be applied to electronic paper. An electronic paper can be used for electronic devices of a variety of fields as long as they can display data. For example, electronic paper can be applied to an electronic book (e-book) reader, a poster, an advertisement in a vehicle such as a train, a digital signage, a public information display (PID), displays of various cards such as a credit card, and the like. An example of the electronic device is illustrated in FIG. 13.

Figure 13:
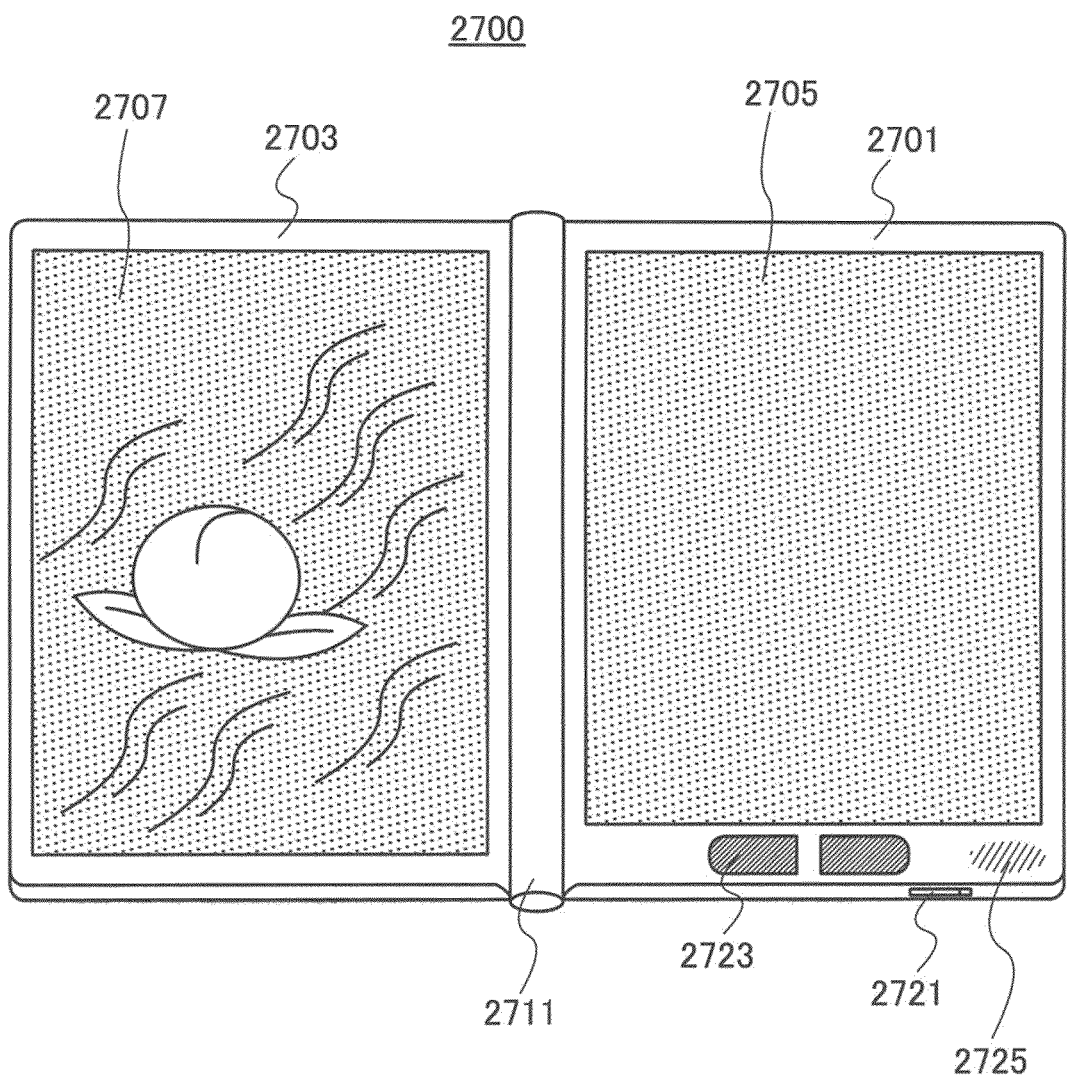
FIG. 13 is an external view illustrating an example of an electronic book reader.

FIG. 13 illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed in different display portions, for example, the right display portion (the display portion 2705 in FIG. 13) can display text and the left display portion (the display portion 2707 in FIG. 13) can display images.

FIG. 13 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USE terminal, a terminal that can be connected to various cables such as an AC adapter and a USB cable, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

(Embodiment 8)

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 14A:
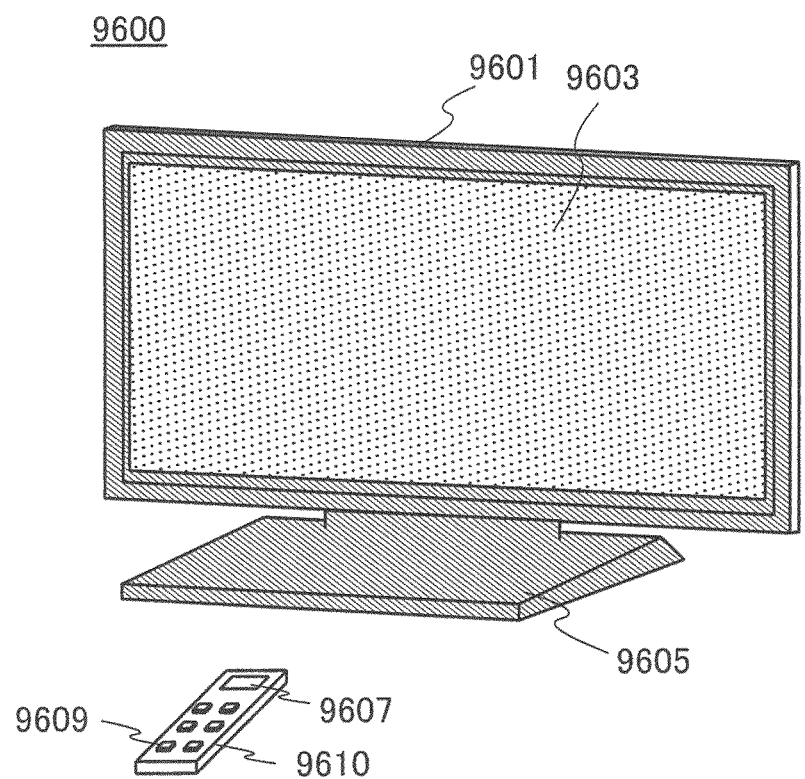
FIGS. 14A and 14B are external views illustrating examples of a television set and a digital photo frame, respectively.

FIG. 14A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 14B:
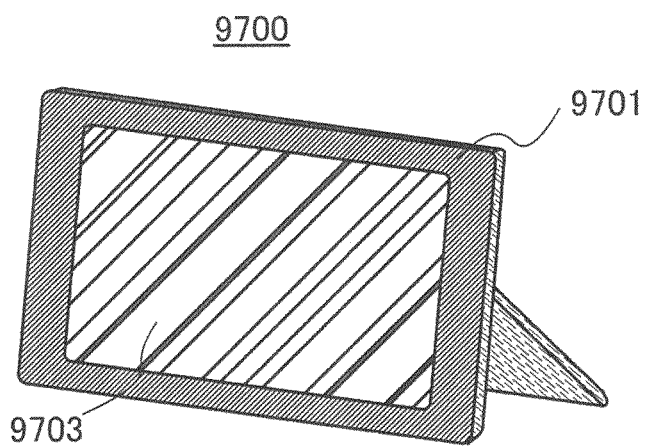

FIG. 14B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 15:
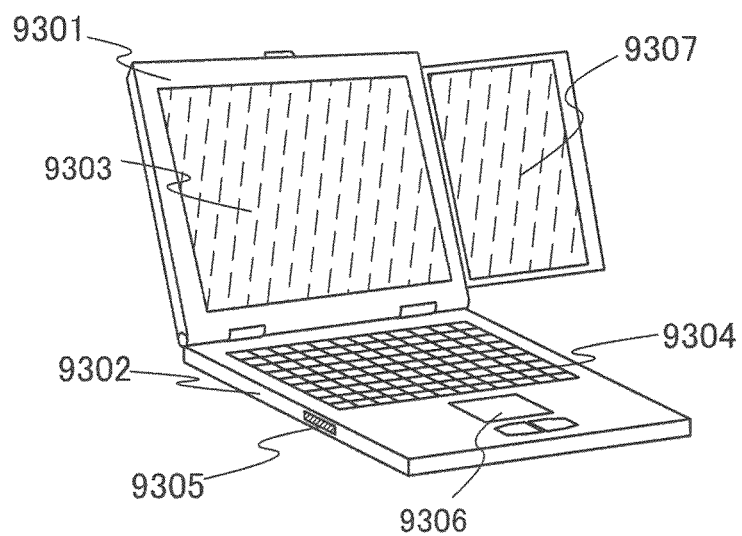
FIG. 15 is a perspective view illustrating an example of a portable computer.

FIG. 15 is a perspective view illustrating an example of a portable computer.

In the portable computer in FIG. 15, a top housing 9301 having a display portion 9303 and a bottom housing 9302 having a keyboard 9304 can overlap with each other by closing a hinge unit which connects the top housing 9301 and the bottom housing 9302. The portable computer in FIG. 15 can be convenient for carrying, and in the case of using the keyboard for input, the hinge unit is opened so that the user can input looking at the display portion 9303.

The bottom housing 9302 includes a pointing device 9306 with which input can be performed, in addition to the keyboard 9304. Further, when the display portion 9303 is a touch input panel, input can be performed by touching a part of the display portion. The bottom housing 9302 includes an arithmetic function portion such as a CPU or hard disk. In addition, the bottom housing 9302 includes an external connection port 9305 into which another device such as a communication cable conformable to communication standards of a USB is inserted.

The top housing 9301 includes a display portion 9307 and can keep the display portion 9307 therein by sliding it toward the inside of the top housing 9301; thus, the top housing 9301 can have a large display screen. In addition, the user can adjust the orientation of a screen of the display portion 9307 which can be kept in the top housing 9301. When the display portion 9307 which can be kept in the top housing 9301 is a touch input panel, input can be performed by touching a part of the display portion 9307 which can be kept in the top housing 9301.

The display portion 9303 or the display portion 9307 which can be kept in the top housing 9301 are formed with an image display device of a liquid crystal display panel, a light-emitting display panel such as an organic light-emitting element or an inorganic light-emitting element, or the like.

In addition, the portable computer illustrated in FIG. 15 can include a receiver and the like and can receive a TV broadcast to display images on the display portion. The user can watch television broadcast when the whole screen of the display portion 9307 is exposed by sliding the display portion 9307 while the hinge unit which connects the top housing 9301 and the bottom housing 9302 is kept closed. In this case, the hinge unit is not opened and display is not performed on the display portion 9303. In addition, start up of only a circuit for displaying television broadcast is performed. Therefore, power can be consumed to the minimum, which is useful for the portable computer whose battery capacity is limited.

EXAMPLE 1

In this example, described will be the single-gate thin film transistor illustrated in FIG. 7A, which is the thin film transistor described in Embodiment 3.

First, a manufacturing process of the thin film transistor will be described with reference to FIGS. 9A to 9D, FIGS. 10A to 10D, and FIGS. 12A and 12B.

The gate electrode 103 was formed over the substrate 101.

Here, a glass substrate (EAGLE XG manufactured by Corning Incorporated) was used as the substrate 101.

A titanium layer with a thickness of 50 nm was formed over the substrate 101 by sputtering a titanium target with use of argon ions at a flow rate of 20 sccm. Then, an aluminum layer with a thickness of 380 nm was formed thereover by sputtering an aluminum target with use of argon ions at a flow rate of 50 sccm. Then, a titanium layer with a thickness of 120 nm was formed thereover by sputtering a titanium target with use of argon ions at a flow rate of 20 sccm. Next, after the titanium layer was coated with a resist, exposure was performed using a first photomask. After that, development was performed, so that a resist mask was formed.

Next, etching was performed using the resist mask, so that the gate electrode 103 was formed. Here, with use of an inductively coupled plasma (ICP) apparatus, a first etching treatment was performed under conditions that the ICP power was 600 W, the bias power was 250 W, the pressure was 1.2 Pa, and an etching gas included boron chloride at a flow rate of 60 sccm and chlorine at a flow rate of 20 sccm. Then, a second etching treatment was performed under conditions that the ICP power was 500 W, the bias power was 50 W, the pressure was 2.0 Pa, and an etching gas included carbon fluoride at a flow rate of 80 sccm.

After that, the resist mask was removed.

Next, the gate insulating layer 105 and the microcrystalline semiconductor layer 107 were formed over the substrate 101 and the gate electrode 103. The steps up to here are illustrated in FIG. 9A.

Here, as the gate insulating layer 105, a silicon nitride layer with a thickness of 110 nm and a silicon oxynitride layer with a thickness of 110 nm were formed.

The silicon nitride layer was formed by a plasma CVD method in which plasma discharge was performed using an RF power source frequency of 13.56 MHz and power of an RF power source of 370 W, under the deposition conditions as follows: silane, hydrogen, nitrogen, and ammonia were introduced as source gases at the flow rates of 40 sccm, 500 sccm, 550 sccm, and 140 sccm, respectively, and were stabilized; the pressure of a treatment chamber was set to 100 Pa; and the substrate temperature was set to 280° C.

The silicon oxynitirde layer was formed by a plasma CVD method in which plasma discharge was performed using an RF power source frequency of 13.56 MHz and power of an RF power source of 30 W, under the deposition conditions as follows: silane and nitrous oxide were introduced as source gases at the flow rates of 5 sccm and 600 sccm, respectively, and were stabilized; the pressure of a treatment chamber was set to 25 Pa; and the substrate temperature was set to 280° C.

Next, after the substrate was taken out from the treatment chamber, the inside of the treatment chamber was cleaned, and an amorphous silicon layer was deposited as a protective layer in the treatment chamber. Then, the substrate was transferred into the treatment chamber, and the microcrystalline semiconductor layer 107 was formed to have a thickness of 30 nm.

The microcrystalline semiconductor layer 107 was formed by a plasma CVD method in which plasma discharge was performed using an RF power source frequency of 13.56 MHz and power of an RF power source of 50 W, under the deposition conditions as follows: silane, hydrogen, and argon were introduced as source gases at the flow rates of 10 sccm, 1500 sccm, and 1500 sccm, respectively, and were stabilized; the pressure of a treatment chamber was set to 280 Pa; and the substrate temperature was set to 280° C.

Next, the semiconductor layer 111 was formed over the microcrystalline semiconductor layer 107, and the impurity semiconductor layer 113 was formed over the semiconductor layer 111.

The semiconductor layer 111 was formed by a plasma CVD method in which plasma discharge was performed using an RF power source frequency of 13.56 MHz and power of an RF power source of 50 W, under the deposition conditions as follows: silane, 1000 ppm ammonia (diluted with hydrogen), and hydrogen were introduced as source gases at flow rates of 30 sccm, 25 sccm, and 1475 sccm, respectively, and were stabilized; the pressure of a treatment chamber was set to 280 Pa; and the substrate temperature was set to 280° C.

As the impurity semiconductor layer 113, an amorphous silicon layer to which phosphorus was added was formed to a thickness of 50 nm. The impurity semiconductor layer 113 was formed by a plasma CVD method in which plasma discharge was performed using an RF power source frequency of 13.56 MHz and power of an RF power source of 60 W, under the deposition conditions as follows: silane and 0.5% phosphine (diluted with hydrogen) were introduced at flow rates of 100 sccm and 170 sccm, respectively; the deposition temperature was set to 280° C.; and the pressure was set to 170 Pa.

Next, the impurity semiconductor layer 113 was coated with a resist, and exposure to light using a second photomask and development were performed, so that the resist mask 115 was formed, as illustrated in FIG. 9B.

With use of the resist mask 115, the microcrystalline semiconductor layer 107, the semiconductor layer 111, and the impurity semiconductor layer 113 were etched, so that a semiconductor layer 117 including the microcrystalline semiconductor region 117a and the amorphous semiconductor region 117b and the impurity semiconductor layer 121 were formed.

Here, the number of manufactured samples is two (Sample 1 and Sample 2). In Sample 1, with use of an ICP apparatus, etching was performed under the etching conditions as follows: the source power was set to 1000 W, the bias power was set to 80 W, the pressure was set to 1.51 Pa, and chlorine was used as an etching gas at a flow rate of 100 sccm.

In Sample 2, with use of an ICP apparatus, etching was performed under the etching conditions as follows: the TCP power was set to 450 W, the bias power was set to 100 W, the pressure was set to 2.0 Pa, and boron chloride, carbon fluoride, and oxygen were used as etching gases at the flow rates of 36 sccm, 36 sccm, and 8 sccm, respectively.

Next, Sample 2 was subjected to plasma treatment in which side surfaces of the semiconductor layer 117 were exposed to the plasma 123 on the condition that the resist mask 115 was left (see FIG. 9C).

In Sample 2, with use of the ICP apparatus, plasma treatment was performed in an oxygen atmosphere at a flow rate of 100 sccm under the conditions that the source power was set to 2000 W, the bias power was set to 350 W, the pressure was set to 0.67 Pa, and the substrate temperature was set to $-10°$ C., so that the first oxide region 125a and the second oxide region 125b were formed.

Figure 9D:
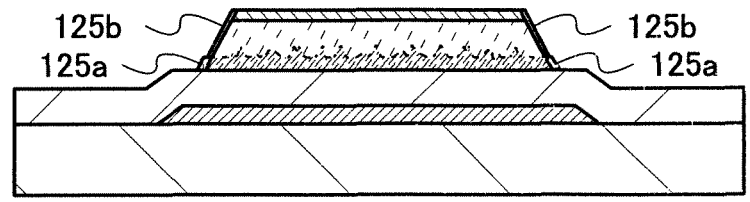

Then, the resist mask 115 was removed (see FIG. 9D).

Next, as illustrated in FIG. 10A, the conductive layer 127 was formed to cover the gate insulating layer 105, the semiconductor layer 117, and the impurity semiconductor layer 121. Here, a titanium layer with a thickness of 50 nm was formed by sputtering a titanium target with use of argon ions at a flow rate of 20 sccm, and an aluminum layer with a thickness of 200 nm was formed thereover by sputtering an aluminum target with use of argon ions at a flow rate of 50 sccm. Then, a titanium layer with a thickness of 50 nm was formed thereover by sputtering a titanium target with use of argon ions at a flow rate of 20 sccm.

Next, after the conductive layer 127 was coated with a resist, exposure was performed using a third photomask. After that, development was performed, so that a resist mask was formed. With use of the resist mask, dry etching was performed. In this etching, the conductive layer 127 was etched, so that the wirings 129a and 129b were formed, and the impurity semiconductor layer 121 was etched, so that the impurity semiconductor layers 131a and 131b functioning as source and drain regions were formed. Further, the microcrystalline semiconductor region 143a and the amorphous semiconductor region 143b were formed.

Here, the etching conditions were as follows: the ICP power was 450 W; the bias power was 100 W; the pressure was 1.9 Pa; and the etching gases included boron chloride at a flow rate of 60 sccm and chlorine at a flow rate of 20 sccm. Note that in this example, the planar shape of the wirings 129a and 129b functioning as the source electrode and drain electrode is linear.

After that, the resist mask was removed. The structure provided through the steps up to here is illustrated in FIG. 12A.

Next, the surfaces of the microcrystalline semiconductor region 143a and the amorphous semiconductor region 143b were irradiated with carbon fluoride plasma, so that an impurity remaining on the surface of the semiconductor layer 143 was removed. Here, the etching conditions were as follows: the source power was set to 1000 W; the bias power was set to 0 W; the pressure was set to 0.67 Pa; and the etching gas was carbon fluoride at a flow rate of 100 sccm.

Next, a 300-nm-thick silicon nitride layer was formed as the insulating layer 137.

Then, the insulating layer 137 was coated with a resist, and exposure using a fourth photomask and development were performed, so that a resist mask was formed. With use of the resist mask, the insulating layer was partly etched with a dry etching mode, so that the wirings 129a and 129b functioning as the source and drain electrodes were partly exposed. In addition, a part of the insulating layer 137 and a part of the gate insulating layer 105 were etched with a dry etching mode, so that the gate electrode 103 was exposed. After that, the resist mask was removed.

Through the above-described steps, the thin film transistor was manufactured.

Figure 16A:
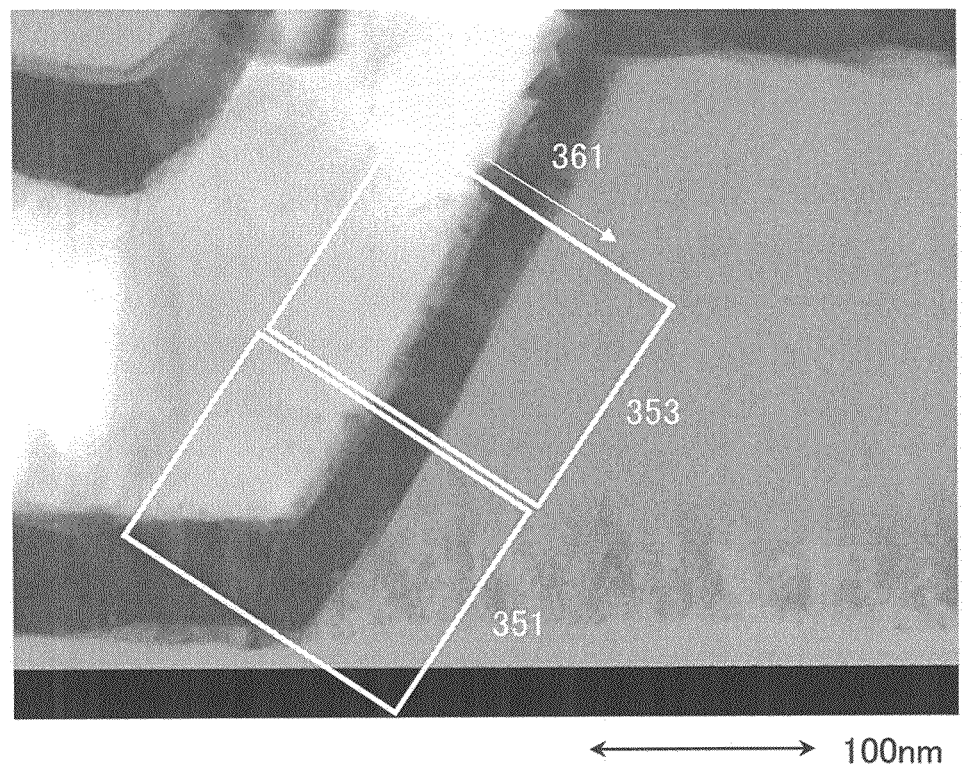
FIGS. 16A and 16B are STEM images each showing a thin film transistor manufactured in Example 1.
Figure 16B:
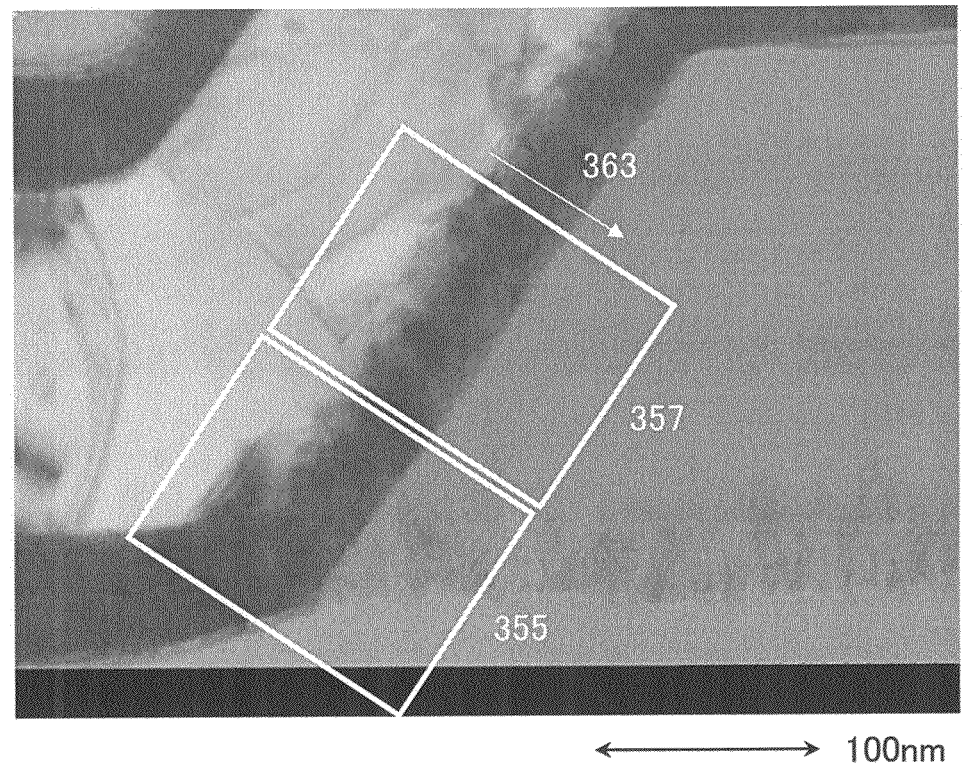

FIGS. 16A and 16B are STEM images each showing a part of a thin film transistor which was manufactured by the above steps. FIG. 16A is a STEM image of Sample 1, and FIG. 16B is a STEM image of Sample 2.

In a measurement region 351 and a measurement region 353 shown in FIG. 16A, energy dispersive X-ray spectroscopy (line analysis) was performed in a measurement direction 361.

In a measurement region 355 and a measurement region 357 shown in FIG. 16B, energy dispersive X-ray spectroscopy (line analysis) was performed in a measurement direction 363.

Figure 17A:
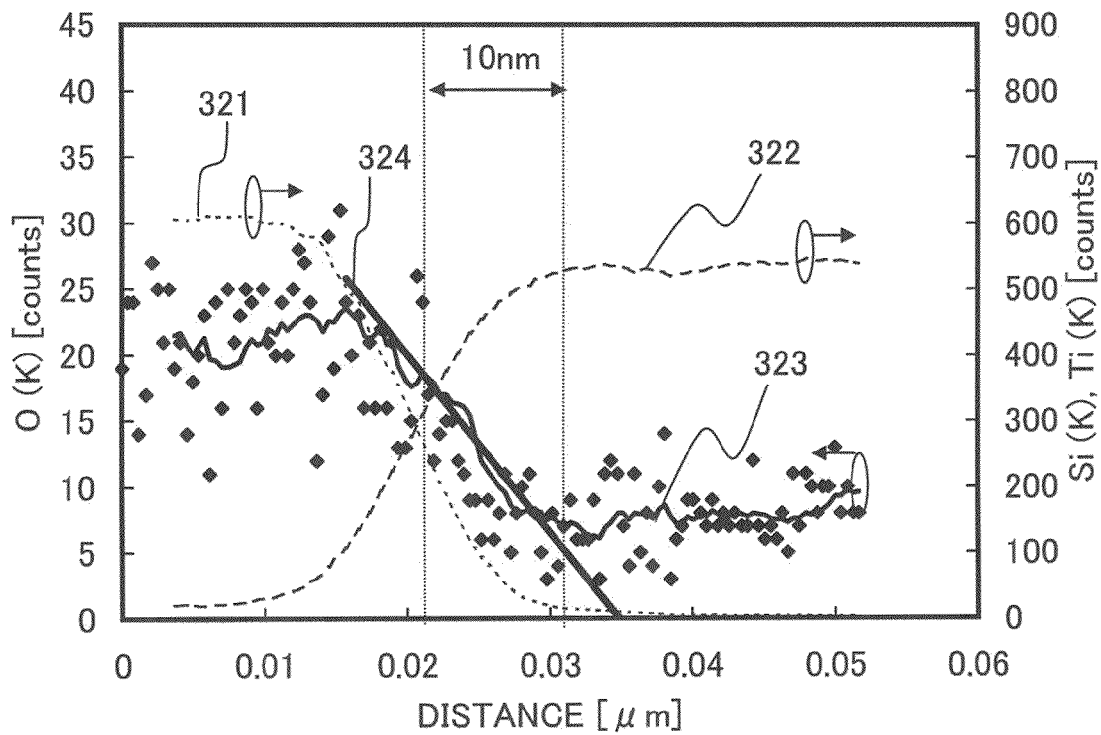
FIGS. 17A and 17B are graphs showing results of EDX measurement.
Figure 17B:
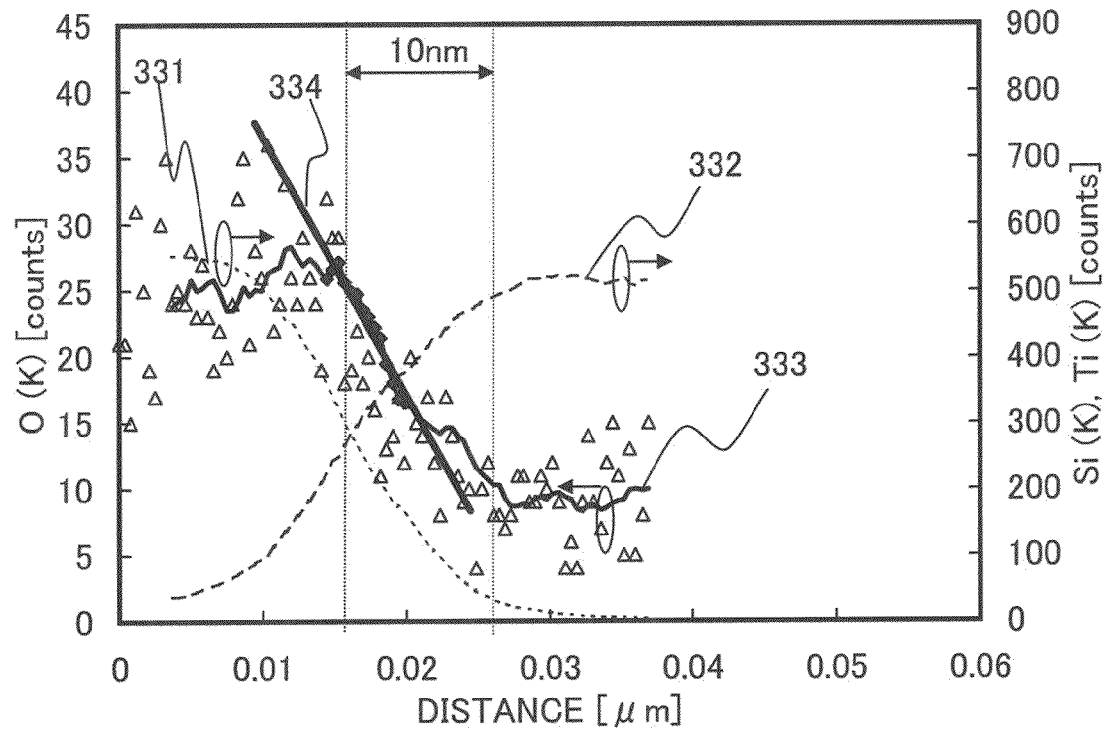

FIG. 17A shows an EDX profile of titanium, silicon, and oxygen in the measurement region 351 (the vicinity of an interface between the microcrystalline semiconductor region 133a and the wiring 129a or 129b) in Sample 1. FIG. 17B shows an EDX profile of titanium, silicon, and oxygen in the measurement region 353 (the vicinity of an interface between the amorphous semiconductor region 133b and the wiring 129a or 129b) in Sample 1.

Figure 18A:
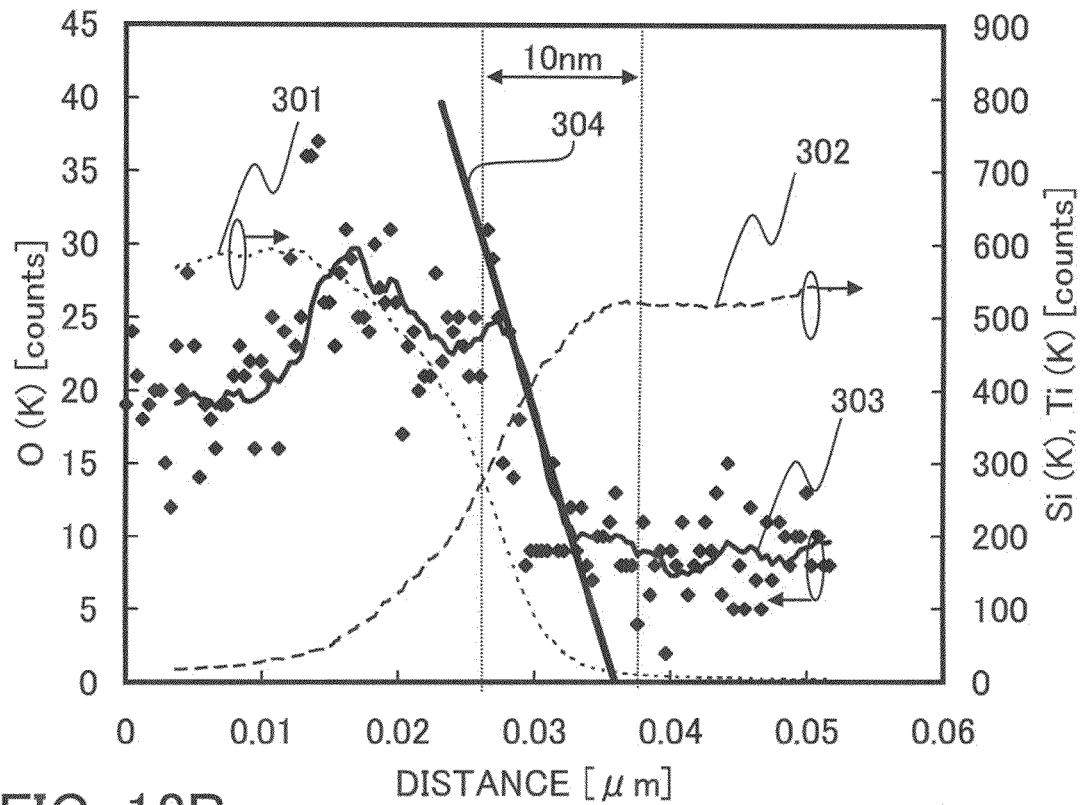
FIGS. 18A and 18B are graphs showing results of EDX measurement.
Figure 18B:
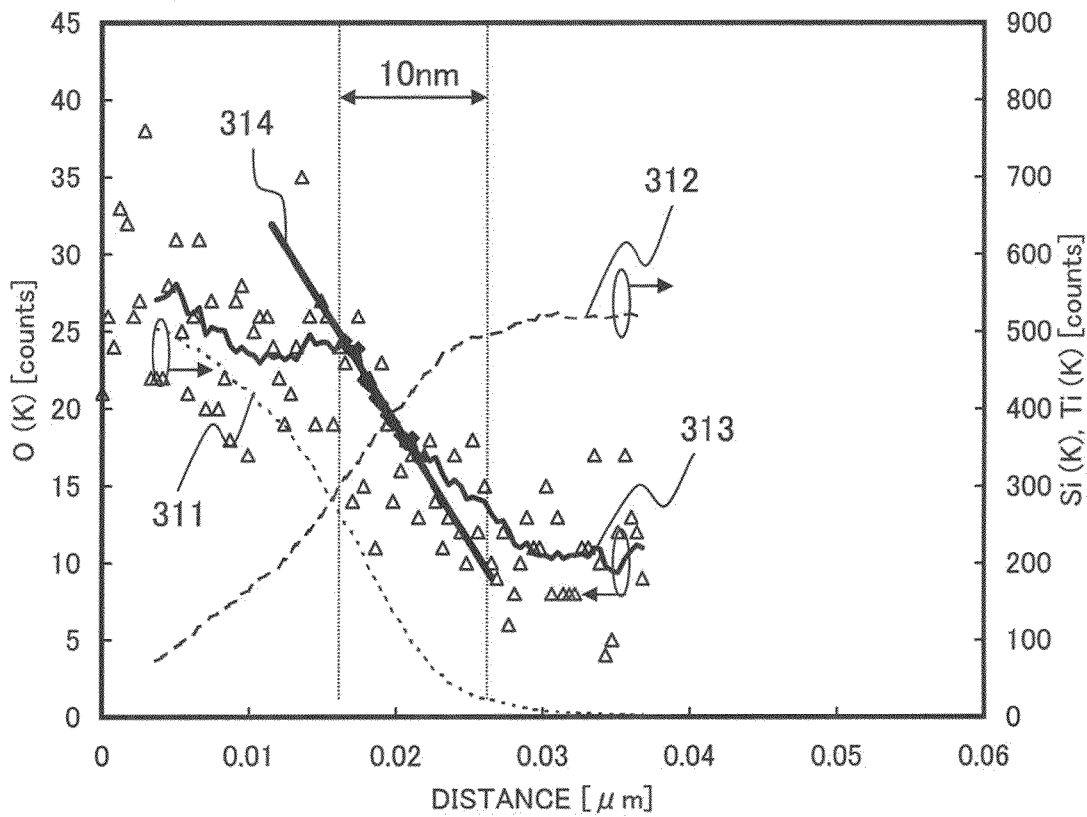

FIG. 18A shows an EDX profile of titanium, silicon, and oxygen in the measurement region 355 (the vicinity of the first oxide region 125a) in Sample 2. FIG. 18B shows an EDX profile of titanium, silicon, and oxygen in the measurement region 357 (the vicinity of the second oxide region 125b) in Sample 2.

In FIGS. 17A and 17B and FIGS. 18A and 18B, each horizontal axis represents a measurement distance from the measurement start point of the sample, each left vertical axis represents the oxygen count number, and each right vertical axis represents the count number of titanium and silicon. Rhombuses and triangles represent the oxygen count number. Broken lines 301, 311, 321, and 331 each represent a titanium profile, broken lines 302, 312, 322, and 332 each represent a silicon profile, and solid lines 303, 313, 323, and 333 each represent the averages of oxygen in ranges each divided into 10 sections. Solid lines 304, 314, 324, and 334 each represent a line tangent to the highest inclination of the curved line representing the averages of oxygen in ranges each divided into 10 sections. Note that the line tangent to the highest inclination was measured in a range of 10 nm on the silicon side from the intersection of the titanium profile and the silicon profile.

Figure 19:
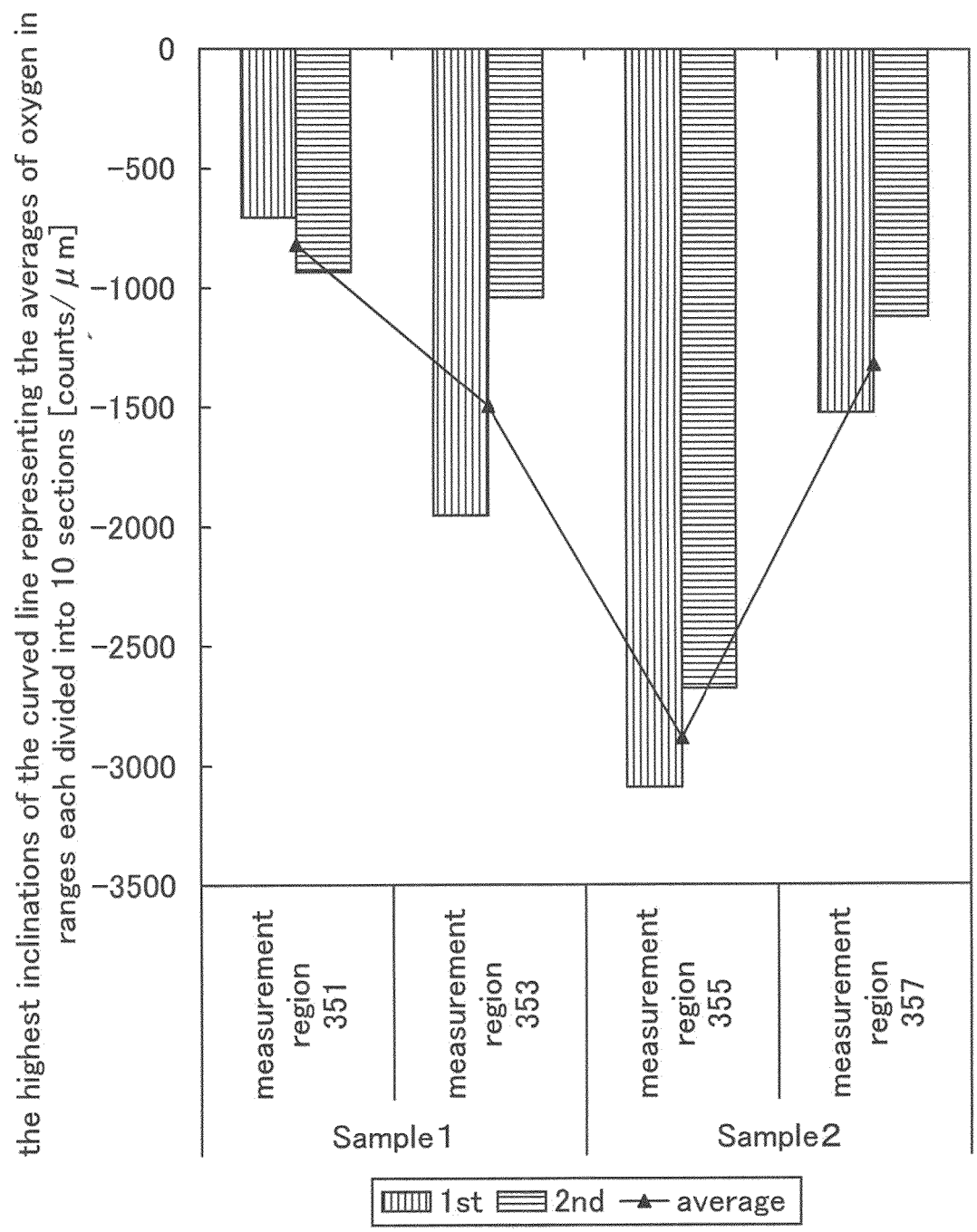
FIG. 19 is a graph showing the highest inclination of averages of oxygen in ranges each divided into 10 sections, based on the results of EDX measurement.

Further, FIG. 19 is a bar graph showing the highest inclinations of the curved line representing the averages of oxygen in ranges each divided into 10 sections in Sample 1 and Sample 2. Note that the EDX measurement was performed twice in each measurement region, and the average values are represented by triangles in FIG. 19 and shown in Table 1.

TABLE 1

|  | Sample 1 | | Sample 2 | |
| --- | --- | --- | --- | --- |
|  | measurement region 351 | measurement region 353 | measurement region 355 | measurement region 357 |
| the highest inclination [counts/μm] | −819.84 | −1496.6 | −2884.5 | −1321.65 |

As can be seen from FIGS. 18A and 18B and FIG. 19, the highest inclination of the averages of oxygen in ranges each divided into 10 sections in the first oxide region 125a formed on the side surface of the microcrystalline semiconductor region is larger than the highest inclination of the averages of oxygen in ranges each divided into 10 sections in the second oxide region 125b formed on the side surface of the amorphous semiconductor region.

As a comparative example, the inclination of the solid line 324 in FIG. 17A and the inclination of the solid line 334 in FIG. 17B are compared with each other. The comparison shows that the interface between the microcrystalline semiconductor region 133a and the wiring 129a or 129b has the highest inclination of the averages of oxygen in ranges each divided into 10 sections which is smaller than that of the interface between the amorphous semiconductor region 133b and the wiring 129a or 129b. As a result, it is found that by performance of oxygen plasma treatment on the side of the microcrystalline semiconductor region 133a, an oxide region which contains a larger amount of oxygen than the amorphous semiconductor region 133b can be formed.

As the above, as in Sample 2, the side surface of the semiconductor layer 117 is subjected to oxygen plasma treatment, so that an oxide region which contains a larger amount of oxygen can be formed on the side of the microcrystalline semiconductor region 133a. The oxide region formed on the side of the microcrystalline semiconductor region enables the off current of the thin film transistor to be reduced.

This application is based on Japanese Patent Application serial no. 2009-298372 filed with Japan Patent Office on Dec. 28, 2009, the entire contents of which are hereby incorporated by reference.

What is claimed is:

1. A thin film transistor, comprising:
a gate electrode;
a gate insulating layer covering the gate electrode;
a semiconductor layer which is provided over the gate insulating layer and includes a microcrystalline semiconductor region and an amorphous semiconductor region on the microcrystalline semiconductor region;
an impurity semiconductor layer on the semiconductor layer;
a wiring on the impurity semiconductor layer;
a first oxide region provided between a side face of the microcrystalline semiconductor region and the wiring; and
a second oxide region provided between a side face of the amorphous semiconductor region and the wiring,
wherein a line tangent to the highest inclination of an oxygen profile in the first oxide region (m1) and a line tangent to the highest inclination of an oxygen profile in the second oxide region (m2) satisfy a relation of 1<m1/m2<10, on the semiconductor layer side from an intersection of a profile of an element included in the wiring and a profile of an element included in the semiconductor layer.

2. A thin film transistor, comprising:
a gate electrode;
a gate insulating layer covering the gate electrode;
a back-gate electrode provided opposite site of the gate electrode;
an interlayer insulating layer in contact with the back-gate electrode;
a semiconductor layer which includes a microcrystalline semiconductor region and an amorphous semiconductor region on the microcrystalline semiconductor region and is provided between the gate insulating layer and the interlayer insulating layer;
an impurity semiconductor layer on the semiconductor layer;
a wiring on the impurity semiconductor layer;
a first oxide region provided between the microcrystalline semiconductor region and the wiring; and
a second oxide region provided between a side face of the amorphous semiconductor region and the wiring,
wherein a line tangent to the highest inclination of an oxygen profile in the first oxide region (m1) and a line tangent to the highest inclination of an oxygen profile in the second oxide region (m2) satisfy a relation of 1<m1/m2<10, on the semiconductor layer side from an intersection of a profile of an element included in the wiring and a profile of an element included in the semiconductor layer.

3. The thin film transistor according to claim 2, wherein the gate electrode and the back-gate electrode are connected to each other.

4. The thin film transistor according to claim 1, wherein the second oxide region is formed between the impurity semiconductor layer and the wiring as well as between the amorphous semiconductor region and the wiring.

5. The thin film transistor according to claim 2, wherein the second oxide region is formed between the impurity semiconductor layer and the wiring as well as between the amorphous semiconductor region and the wiring.

6. The thin film transistor according to claim 1, wherein the microcrystalline semiconductor region is in contact with the gate insulating layer.

7. The thin film transistor according to claim 2, wherein the microcrystalline semiconductor region is in contact with the gate insulating layer.

8. The thin film transistor according to claim 1, wherein the amorphous semiconductor region is divided, and
wherein a part of the microcrystalline semiconductor region is exposed in a region overlapping with the gate electrode.

9. The thin film transistor according to claim 2, wherein the amorphous semiconductor region is divided, and
wherein a part of the microcrystalline semiconductor region is exposed in a region overlapping with the gate electrode.

10. The thin film transistor according to claim 1, wherein the semiconductor layer comprises silicon, and
wherein the first oxide region and the second oxide region comprise silicon oxide.

11. The thin film transistor according to claim 2,
wherein the semiconductor layer comprises silicon, and
wherein the first oxide region and the second oxide region comprise silicon oxide.
12. The thin film transistor according to claim 1,
wherein the semiconductor layer comprises silicon,
wherein the wiring comprises titanium,
wherein the first oxide region comprises silicon oxide, and
wherein the second oxide region comprises titanium oxide.
13. The thin film transistor according to claim 2,
wherein the semiconductor layer comprises silicon,
wherein the wiring comprises titanium,
wherein the first oxide region comprises silicon oxide, and
wherein the second oxide region comprises titanium oxide.
14. The thin film transistor according to claim 1,
wherein the microcrystalline semiconductor region has a projected and depressed shape.
15. The thin film transistor according to claim 2,
wherein the microcrystalline semiconductor region has a projected and depressed shape.
16. The thin film transistor according to claim 1,
wherein the profiles are manufactured by energy dispersive X-ray spectroscopy.
17. The thin film transistor according to claim 2,
wherein the profiles are manufactured by energy dispersive X-ray spectroscopy.
18. The thin film transistor according to claim 1,
wherein the first oxide region is thicker than the second oxide region.
19. The thin film transistor according to claim 2,
wherein the first oxide region is thicker than the second oxide region.
20. The thin film transistor according to claim 1,
wherein the first oxide region is an oxide region having a higher insulating property than the second oxide region.
21. The thin film transistor according to claim 2,
wherein the first oxide region is an oxide region having a higher insulating property than the second oxide region.
22. The thin film transistor according to claim 1,
wherein the second oxide region is also provided on the surface of the impurity semiconductor layer.
23. The thin film transistor according to claim 2,
wherein the second oxide region is also provided on the surface of the impurity semiconductor layer.

* * * * *